(12) United States Patent
Nguyen

(10) Patent No.: US 10,115,838 B2
(45) Date of Patent: Oct. 30, 2018

(54) PHOTOVOLTAIC STRUCTURES WITH INTERLOCKING BUSBARS

(71) Applicant: SolarCity Corporation, San Mateo, CA (US)

(72) Inventor: Peter P. Nguyen, San Jose, CA (US)

(73) Assignee: Tesla, Inc., Palo Alto, CA (US)

( * ) Notice: Subject to any disclaimer, the term of this patent is extended or adjusted under 35 U.S.C. 154(b) by 239 days.

(21) Appl. No.: 15/133,003

(22) Filed: Apr. 19, 2016

(65) Prior Publication Data
US 2017/0301801 A1 Oct. 19, 2017

(51) Int. Cl.
| | |
|---|---|
| *H01L 31/0236* | (2006.01) |
| *H01L 31/02* | (2006.01) |
| *H01L 31/0224* | (2006.01) |
| *H01L 31/0747* | (2012.01) |
| *H01L 31/18* | (2006.01) |

(52) U.S. Cl.
CPC .. *H01L 31/0201* (2013.01); *H01L 31/022433* (2013.01); *H01L 31/022466* (2013.01); *H01L 31/0747* (2013.01); *H01L 31/1804* (2013.01); *H01L 31/1884* (2013.01)

(58) Field of Classification Search
CPC ......... H01L 31/0201; H01L 31/022433; H01L 31/0236; H01L 31/02363; H01L 31/02366
See application file for complete search history.

(56) References Cited

U.S. PATENT DOCUMENTS

| | | |
|---|---|---|
| 819,360 A | 3/1902 | Mayer |
| 2,938,938 A | 5/1960 | Dickson |
| 3,094,439 A | 6/1963 | Mann et al. |

(Continued)

FOREIGN PATENT DOCUMENTS

| | | |
|---|---|---|
| CN | 1253381 | 5/2000 |
| CN | 1416179 | 10/2001 |

(Continued)

OTHER PUBLICATIONS

"Nonequilibrium boron doping effects in low-temperature epitaxial silicon" Meyerson et al., Appl. Phys. Lett. 50 (2), p. 113 (1987).

(Continued)

*Primary Examiner* — Magali P Slawski
(74) *Attorney, Agent, or Firm* — Shun Yao; Park, Vaughan, Fleming & Dowler LLP

(57) ABSTRACT

One embodiment can provide a current-collecting mechanism of a photovoltaic structure. The current-collecting mechanism can include a top metallic grid positioned on a top surface of the photovoltaic structure and a bottom metallic grid positioned on the bottom surface of the photovoltaic structure. The top metallic grid can include a top busbar positioned near an edge of the photovoltaic structure, and the bottom metallic grid can include a bottom busbar positioned near an opposite edge. The top busbar and the bottom busbar can have complementary topology profiles such that, when the edge of the photovoltaic structure overlaps with an opposite edge of an adjacent photovoltaic structure, the top busbar of the photovoltaic structure and the bottom busbar of the adjacent photovoltaic structure interlock with each other.

14 Claims, 13 Drawing Sheets

(56) References Cited

U.S. PATENT DOCUMENTS

| | | |
|---|---|---|
| 3,116,171 A | 12/1963 | Nielsen |
| 3,459,597 A | 8/1969 | Baron |
| 3,676,179 A | 7/1972 | Bokros |
| 3,961,997 A | 6/1976 | Chu |
| 3,969,163 A | 7/1976 | Wakefield |
| 4,015,280 A | 3/1977 | Matsushita et al. |
| 4,082,568 A | 4/1978 | Lindmayer |
| 4,124,410 A | 11/1978 | Kotval et al. |
| 4,124,455 A | 11/1978 | Lindmayer |
| 4,193,975 A | 3/1980 | Kotval et al. |
| 4,200,621 A | 4/1980 | Liaw et al. |
| 4,213,798 A | 7/1980 | Williams et al. |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder et al. |
| 4,342,044 A | 7/1982 | Ovshinsky et al. |
| 4,431,858 A | 2/1984 | Gonzalez et al. |
| 4,514,579 A | 4/1985 | Hanak |
| 4,540,843 A | 9/1985 | Gochermann et al. |
| 4,567,642 A | 2/1986 | Dilts et al. |
| 4,571,448 A | 2/1986 | Barnett |
| 4,577,051 A | 3/1986 | Hartman |
| 4,586,988 A | 5/1986 | Nath et al. |
| 4,589,191 A | 5/1986 | Green et al. |
| 4,612,409 A | 9/1986 | Hamakawa et al. |
| 4,617,421 A | 10/1986 | Nath |
| 4,633,033 A | 12/1986 | Nath et al. |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington et al. |
| 4,729,970 A | 3/1988 | Nath |
| 4,753,683 A | 6/1988 | Ellion |
| 4,771,017 A | 9/1988 | Tobin et al. |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,057,163 A | 10/1991 | Barnett |
| 5,075,763 A | 12/1991 | Spitzer et al. |
| 5,084,107 A | 1/1992 | Deguchi |
| 5,118,361 A | 6/1992 | Fraas |
| 5,131,933 A | 7/1992 | Flodl et al. |
| 5,155,051 A | 10/1992 | Noguchi |
| 5,178,685 A | 1/1993 | Borenstein |
| 5,181,968 A | 1/1993 | Nath et al. |
| 5,213,628 A | 5/1993 | Noguchi et al. |
| 5,217,539 A | 6/1993 | Fraas et al. |
| 5,279,682 A | 1/1994 | Wald et al. |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi et al. |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo et al. |
| 5,676,766 A | 10/1997 | Probst et al. |
| 5,681,402 A | 10/1997 | Ichinose et al. |
| 5,698,451 A | 12/1997 | Hanoka |
| 5,705,828 A | 1/1998 | Noguchi et al. |
| 5,726,065 A | 3/1998 | Szlufcik et al. |
| 5,808,315 A | 9/1998 | Murakami |
| 5,814,195 A | 9/1998 | Lehan et al. |
| 5,903,382 A | 5/1999 | Tench et al. |
| 5,935,345 A | 8/1999 | Kuznicki |
| 6,017,581 A | 1/2000 | Hooker |
| 6,034,322 A | 3/2000 | Pollard |
| 6,091,019 A | 7/2000 | Sakata et al. |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan et al. |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Szlufcik |
| 6,586,270 B2 | 7/2003 | Tsuzuki et al. |
| 2,626,907 A1 | 9/2003 | Chandra |
| 6,620,645 B2 | 9/2003 | Chandra et al. |
| 6,672,018 B2 | 1/2004 | Shingleton |
| 6,683,360 B1 | 1/2004 | Dierickx |
| 6,736,948 B2 | 5/2004 | Barrett |
| 6,761,771 B2 | 7/2004 | Satoh |
| 6,803,513 B2 | 10/2004 | Beernink |
| 6,841,051 B2 | 1/2005 | Crowley |
| 7,030,413 B2 | 4/2006 | Nakamura et al. |
| 7,128,975 B2 | 10/2006 | Inomata |
| 7,164,150 B2 | 1/2007 | Terakawa et al. |
| 7,328,534 B2 | 2/2008 | Dinwoodie |
| 7,388,146 B2 | 6/2008 | Fraas |
| 7,399,385 B2 | 7/2008 | German et al. |
| 7,534,632 B2 | 5/2009 | Hu et al. |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German et al. |
| 7,977,220 B2 | 7/2011 | Sanjurjo |
| 8,070,925 B2 | 12/2011 | Hoffman et al. |
| 8,115,093 B2 | 2/2012 | Gui |
| 8,119,901 B2 | 2/2012 | Jang |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause et al. |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo et al. |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 9,761,744 B2 | 9/2017 | Wang |
| 2001/0008143 A1 | 7/2001 | Wakita et al. |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes et al. |
| 2003/0070705 A1 | 4/2003 | Hayden et al. |
| 2003/0097447 A1 | 5/2003 | Johnston |
| 2003/0116185 A1 | 6/2003 | Oswald |
| 2003/0118865 A1 | 6/2003 | Marks |
| 2003/0121228 A1 | 7/2003 | Stoehr et al. |
| 2003/0136440 A1 | 7/2003 | Machida |
| 2003/0168578 A1 | 9/2003 | Taguchi et al. |
| 2003/0183270 A1 | 10/2003 | Falk et al. |
| 2003/0201007 A1 | 10/2003 | Fraas |
| 2004/0035458 A1 | 2/2004 | Beernink |
| 2004/0065363 A1 | 4/2004 | Fetzer et al. |
| 2004/0103937 A1 | 6/2004 | Bilyalov et al. |
| 2004/0112419 A1 | 6/2004 | Boulanger |
| 2004/0112426 A1 | 6/2004 | Hagino |

(56) References Cited

U.S. PATENT DOCUMENTS

| | | |
|---|---|---|
| 2004/0123897 A1 | 7/2004 | Ojima et al. |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira et al. |
| 2005/0022746 A1 | 2/2005 | Lampe |
| 2005/0022861 A1 | 2/2005 | Rose et al. |
| 2005/0061665 A1 | 3/2005 | Pavani |
| 2005/0062041 A1 | 3/2005 | Terakawa |
| 2005/0064247 A1 | 3/2005 | Sane |
| 2005/0074954 A1 | 4/2005 | Yamanaka |
| 2005/0109388 A1 | 5/2005 | Murakami et al. |
| 2005/0126622 A1 | 6/2005 | Mukai |
| 2005/0133084 A1 | 6/2005 | Joge et al. |
| 2005/0178662 A1 | 8/2005 | Wurczinger |
| 2005/0189015 A1 | 9/2005 | Rohatgi et al. |
| 2005/0199279 A1 | 9/2005 | Yoshimine et al. |
| 2005/0252544 A1 | 11/2005 | Rohatgi et al. |
| 2005/0257823 A1 | 11/2005 | Zwanenburg |
| 2005/0268963 A1 | 12/2005 | Jordan |
| 2006/0012000 A1 | 1/2006 | Estes et al. |
| 2006/0060238 A1 | 3/2006 | Hacke et al. |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach et al. |
| 2006/0231803 A1 | 10/2006 | Wang et al. |
| 2006/0255340 A1 | 11/2006 | Manivannan et al. |
| 2006/0260673 A1 | 11/2006 | Takeyama |
| 2006/0272698 A1 | 12/2006 | Durvasula |
| 2006/0283496 A1 | 12/2006 | Okamoto et al. |
| 2006/0283499 A1 | 12/2006 | Terakawa et al. |
| 2007/0023081 A1 | 2/2007 | Johnson et al. |
| 2007/0023082 A1 | 2/2007 | Manivannan et al. |
| 2007/0108437 A1 | 5/2007 | Tavkhelidze |
| 2007/0110975 A1 | 5/2007 | Schneweis |
| 2007/0132034 A1 | 6/2007 | Curello et al. |
| 2007/0137699 A1 | 6/2007 | Manivannan et al. |
| 2007/0148336 A1 | 6/2007 | Bachrach et al. |
| 2007/0186853 A1 | 8/2007 | Gurary |
| 2007/0186968 A1 | 8/2007 | Nakauchi |
| 2007/0186970 A1 | 8/2007 | Takahashi et al. |
| 2007/0187652 A1 | 8/2007 | Konno |
| 2007/0202029 A1 | 8/2007 | Burns et al. |
| 2007/0235077 A1 | 10/2007 | Nagata |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann et al. |
| 2007/0283997 A1 | 12/2007 | Hachtmann |
| 2008/0000522 A1 | 1/2008 | Johnson |
| 2008/0011350 A1 | 1/2008 | Luch |
| 2008/0035489 A1 | 2/2008 | Allardyce |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar et al. |
| 2008/0053519 A1 | 3/2008 | Pearce |
| 2008/0061293 A1 | 3/2008 | Ribeyron |
| 2008/0092947 A1 | 4/2008 | Lopatin et al. |
| 2008/0121272 A1 | 5/2008 | Besser et al. |
| 2008/0121276 A1 | 5/2008 | Lopatin et al. |
| 2008/0121932 A1 | 5/2008 | Ranade |
| 2008/0128013 A1 | 6/2008 | Lopatin |
| 2008/0128017 A1 | 6/2008 | Ford |
| 2008/0149161 A1 | 6/2008 | Nishida et al. |
| 2008/0149163 A1 | 6/2008 | Gangemi |
| 2008/0156370 A1 | 7/2008 | Abdallah et al. |
| 2008/0173347 A1 | 7/2008 | Korevaar |
| 2008/0173350 A1 | 7/2008 | Choi et al. |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness et al. |
| 2008/0223439 A1 | 9/2008 | Deng |
| 2008/0230122 A1 | 9/2008 | Terakawa |
| 2008/0251114 A1 | 10/2008 | Tanaka |
| 2008/0251117 A1 | 10/2008 | Schubert et al. |
| 2008/0264477 A1 | 10/2008 | Moslehi |
| 2008/0276983 A1 | 11/2008 | Drake et al. |
| 2008/0283115 A1 | 11/2008 | Fukawa et al. |
| 2008/0302030 A1 | 12/2008 | Stancel et al. |
| 2008/0303503 A1 | 12/2008 | Wolfs |
| 2008/0308145 A1 | 12/2008 | Krasnov et al. |
| 2009/0007965 A1 | 1/2009 | Rohatgi et al. |
| 2009/0014055 A1 | 1/2009 | Beck |
| 2009/0056805 A1 | 3/2009 | Barnett |
| 2009/0065043 A1 | 3/2009 | Hadorn |
| 2009/0078318 A1 | 3/2009 | Meyers et al. |
| 2009/0084439 A1 | 4/2009 | Lu et al. |
| 2009/0101872 A1 | 4/2009 | Young et al. |
| 2009/0120492 A1 | 5/2009 | Sinha |
| 2009/0139512 A1 | 6/2009 | Lima |
| 2009/0151771 A1 | 6/2009 | Kothari |
| 2009/0151783 A1 | 6/2009 | Lu et al. |
| 2009/0155028 A1 | 6/2009 | Boguslayskiy |
| 2009/0160259 A1 | 6/2009 | Ravindranath |
| 2009/0188561 A1 | 7/2009 | Aiken et al. |
| 2009/0194233 A1 | 8/2009 | Tamura |
| 2009/0221111 A1 | 9/2009 | Frolov et al. |
| 2009/0229854 A1 | 9/2009 | Fredenberg |
| 2009/0239331 A1 | 9/2009 | Xu et al. |
| 2009/0250108 A1 | 10/2009 | Zhou et al. |
| 2009/0255574 A1 | 10/2009 | Yu et al. |
| 2009/0272419 A1 | 11/2009 | Sakamoto |
| 2009/0283138 A1 | 11/2009 | Lin et al. |
| 2009/0283145 A1 | 11/2009 | Kim et al. |
| 2009/0293948 A1 | 12/2009 | Tucci et al. |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman et al. |
| 2010/0043863 A1 | 2/2010 | Wudu |
| 2010/0065111 A1 | 3/2010 | Fu et al. |
| 2010/0068890 A1 | 3/2010 | Stockum et al. |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu et al. |
| 2010/0131108 A1 | 5/2010 | Meyer |
| 2010/0132774 A1 | 6/2010 | Borden |
| 2010/0132792 A1 | 6/2010 | Kim et al. |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch et al. |
| 2010/0229914 A1 | 9/2010 | Adriani |
| 2010/0236612 A1 | 9/2010 | Khajehoddin |
| 2010/0240172 A1 | 9/2010 | Rana |
| 2010/0243021 A1 | 9/2010 | Lee |
| 2010/0269904 A1 | 10/2010 | Cousins |
| 2010/0279492 A1 | 11/2010 | Yang |
| 2010/0300506 A1 | 12/2010 | Yu |
| 2010/0300507 A1 | 12/2010 | Heng et al. |
| 2010/0300525 A1 | 12/2010 | Lim |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0023958 A1 | 2/2011 | Masson |
| 2011/0030777 A1 | 2/2011 | Lim |
| 2011/0048491 A1 | 3/2011 | Taira |
| 2011/0073175 A1 | 3/2011 | Hilali |
| 2011/0088762 A1 | 4/2011 | Singh |
| 2011/0120518 A1 | 5/2011 | Rust |

(56) References Cited

U.S. PATENT DOCUMENTS

| | | |
|---|---|---|
| 2011/0146759 A1 | 6/2011 | Lee |
| 2011/0146781 A1 | 6/2011 | Laudisio et al. |
| 2011/0156188 A1 | 6/2011 | Tu |
| 2011/0168250 A1 | 7/2011 | Lin et al. |
| 2011/0168261 A1 | 7/2011 | Welser |
| 2011/0174374 A1 | 7/2011 | Harder |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng et al. |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch et al. |
| 2011/0308573 A1 | 12/2011 | Jaus |
| 2012/0000502 A1 | 1/2012 | Wiedeman |
| 2012/0012153 A1 | 1/2012 | Azechi |
| 2012/0012174 A1 | 1/2012 | Wu |
| 2012/0028461 A1 | 2/2012 | Ritchie et al. |
| 2012/0031480 A1 | 2/2012 | Tisler |
| 2012/0040487 A1 | 2/2012 | Asthana |
| 2012/0042925 A1 | 2/2012 | Pfennig |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Heng |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0192932 A1 | 8/2012 | Wu et al. |
| 2012/0199184 A1* | 8/2012 | Nie .................. H01L 27/142 136/255 |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng et al. |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0019919 A1 | 1/2013 | Hoang |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2013/0306128 A1 | 11/2013 | Kannou |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0120699 A1* | 5/2014 | Hua .................. H01L 21/02076 438/463 |
| 2014/0124013 A1 | 5/2014 | Morad et al. |
| 2014/0124014 A1 | 5/2014 | Morad et al. |
| 2014/0154836 A1 | 6/2014 | Kim |
| 2014/0196768 A1 | 7/2014 | Heng et al. |
| 2014/0242746 A1 | 8/2014 | Albadri |
| 2014/0261624 A1 | 9/2014 | Cruz-Campa |
| 2014/0299187 A1 | 10/2014 | Chang |
| 2014/0318611 A1 | 10/2014 | Moslehi |
| 2014/0345674 A1 | 11/2014 | Yang et al. |
| 2014/0349441 A1 | 11/2014 | Fu |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1* | 4/2015 | Yang .................. H01L 31/02243 136/244 |
| 2015/0096613 A1 | 4/2015 | Tjahjono |
| 2015/0114444 A1 | 4/2015 | Lentine |
| 2015/0144180 A1 | 5/2015 | Baccini |
| 2015/0171230 A1 | 6/2015 | Kapur |
| 2015/0214409 A1 | 7/2015 | Pfeiffer |
| 2015/0236177 A1 | 8/2015 | Fu |
| 2015/0270410 A1 | 9/2015 | Heng |
| 2015/0280641 A1 | 10/2015 | Garg |
| 2015/0340531 A1 | 11/2015 | Hayashi |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1* | 12/2015 | Morad .................. H01L 31/05 136/251 |
| 2016/0163888 A1 | 6/2016 | Reddy |
| 2016/0190354 A1 | 6/2016 | Agrawal |
| 2016/0204289 A1 | 7/2016 | Tao |
| 2016/0322513 A1 | 11/2016 | Martin |
| 2016/0329443 A1 | 11/2016 | Wang |
| 2017/0084766 A1 | 3/2017 | Yang |
| 2017/0222082 A1* | 8/2017 | Lin .................. H01L 31/052 |

FOREIGN PATENT DOCUMENTS

| | | |
|---|---|---|
| CN | 101233620 | 7/2008 |
| CN | 101553933 | 10/2009 |
| CN | 102012010151 | 1/2010 |
| CN | 101305454 | 5/2010 |
| CN | 102088040 | 6/2011 |
| CN | 102263157 | 11/2011 |
| CN | 104205347 | 12/2014 |
| CN | 2626907 A1 | 3/2015 |
| DE | 4030713 | 4/1992 |
| DE | 102006009194 | 8/2007 |
| DE | 202007002897 | 8/2008 |
| DE | 102008045522 | 3/2010 |
| DE | 102010061317 | 6/2012 |
| DE | 10201201051 | 11/2013 |
| DE | H04245683 A | 11/2013 |
| EP | 1770791 | 4/2007 |
| EP | 1816684 | 8/2007 |
| EP | 2071635 | 6/2009 |
| EP | 2113946 | 11/2009 |
| EP | 2362430 | 8/2011 |
| EP | 2385561 | 11/2011 |
| EP | 2387079 | 11/2011 |
| EP | 2002057357 A | 11/2011 |
| EP | 2011123646 A2 | 7/2012 |
| EP | 2479796 A1 | 8/2013 |
| EP | 2479796 | 7/2015 |

(56) References Cited

FOREIGN PATENT DOCUMENTS

| | | |
|---|---|---|
| EP | 2626907 | 8/2015 |
| JP | 5789269 | 6/1982 |
| JP | 2011008881 A2 | 9/1992 |
| JP | 06196766 | 7/1994 |
| JP | 2385561 A2 | 9/1995 |
| JP | 10004204 | 1/1998 |
| JP | H1131834 | 2/1999 |
| JP | 200164902 | 6/2000 |
| JP | 2010085949 | 2/2002 |
| JP | 20050122721 A | 6/2005 |
| JP | 2006523025 | 10/2006 |
| JP | 2006324504 | 11/2006 |
| JP | 2007123792 | 5/2007 |
| JP | 2008135655 | 6/2008 |
| JP | 2009054748 | 3/2009 |
| JP | 2009177225 | 8/2009 |
| JP | 2011181966 | 9/2011 |
| JP | 2012119393 | 6/2012 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 2003083953 A1 | 12/2005 |
| KR | 2005159312 A | 1/2006 |
| KR | 2006097189 A1 | 2/2009 |
| WO | 9120097 A1 | 11/1991 |
| WO | 2011005447 A2 | 12/1991 |
| WO | 1991017839 | 10/2003 |
| WO | 20060003277 A | 9/2006 |
| WO | 2008089657 | 7/2008 |
| WO | 2009094578 | 7/2009 |
| WO | 2009150654 | 12/2009 |
| WO | 20090011519 A | 12/2009 |
| WO | 2010070015 | 6/2010 |
| WO | 2009150654 A2 | 7/2010 |
| WO | 2010075606 | 7/2010 |
| WO | H07249788 A | 8/2010 |
| WO | 2010075606 A1 | 9/2010 |
| WO | 100580957 C | 10/2010 |
| WO | 2010123974 | 10/2010 |
| WO | 2010104726 A2 | 1/2011 |
| WO | 2010123974 A1 | 1/2011 |
| WO | 2011005447 | 1/2011 |
| WO | 2011008881 | 1/2011 |
| WO | 2011053006 | 5/2011 |
| WO | 104409402 | 10/2011 |
| WO | 2013020590 | 2/2013 |
| WO | 2013020590 A1 | 2/2013 |
| WO | 2013046351 | 4/2013 |
| WO | 2014066265 | 5/2014 |
| WO | 2014074826 | 5/2014 |
| WO | 2014110520 | 7/2014 |
| WO | 2014117138 | 7/2014 |
| WO | 2015183827 | 12/2015 |
| WO | 2016090332 | 6/2016 |

OTHER PUBLICATIONS

"Doping Diffusion and Implantation" Parthavi, <http://www.leb.eei.uni-erlangen.de/winterakademie/2010/report/content/course03/pdf/0306.pdf>.
Machine translation of JP 10004204 A, Shindou et al.
Electrically Conductive Foil Tape for Bus Bar Components in Photovoltaic Modules, Adhesives Research, http://www.adhesivesresearch.com/electrically-conductive-foil-tape-for-bus-bar-components-in-photovoltaic-modules/, accessed Oct. 12, 2017.
Geissbuhler et al., Silicon Heterojunction solar Cells with Copper-Plated Grid Electrodes: Status and Comparison with Silver Thick-Film Techniques, IEEE Journal of Photovoltaics, vol. 4, No. 4, Jul. 2014.
Meyerson et al. "Nonequilibrium boron doping effects in low-temperature epitaxial silicon", Appl. Phys. Lett. 50 (2), p. 113 (1987).
Li, "Surface and Bulk Passsivation of Multicrystalline Silicon Solar Cells by Silicon Nitride (H) Layer: Modeling and Experiments", Ph.D. dissertation, N.J. Inst. of Tech., Jan. 2009.
Jianhua Zhao et al. "24% Efficient pert silicon solar cell: Recent improvements in high efficiency silicon cell research".
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.
L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.
Davies, P.C.W., 'Quantum tunneling time,' Am. J. Phys. 73, Jan. 2005, pp. 23-27.
Roedern, B. von, et al., 'Why is the Open-Circuit Voltage of Crystalline Si Solar Cells so Critically Dependent on Emitter- and Base-Doping?' Presented at the 9th Workshop on Crystalline Silicon Solar Cell Materials and Processes, Breckenridge, CO, Aug. 9-11, 1999.
Yao Wen-Jie et al: 'Interdisciplinary Physics and Related Areas of Science and Technology; The p recombination later in tunnel junctions for micromorph tandem solar cells',Chinese Physics B, Chinese Physics B, Bristol GB, vol. 20, No. 7, Jul. 26, 2011 (Jul. 26, 2011), p. 78402 XP020207379, ISSN: 1674-1056, DOI: 10.1088/1674-1056/20/7/078402.
Beaucarne G et al: 'Epitaxial thin-film Si solar cells' Thin Solid Films, Elsevier-Sequoia S.A. Lausanne, CH LNKD—D01:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].
National Weather Service Weather Forecast Office ("Why Do We have Seasons?" http://www.crh.noaa.gov/lmk/?n=seasons Accessed Oct. 18, 2014).
Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.
Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20l.pptx> and converted to PDF.
Green, Martin A. et al., 'High-Efficiency Silicon Solar Cells,' IEEE Transactions on Electron Devices, vol. ED-31, No. 5, May 1984, pp. 679-683.
WP Leroy et al., "In Search for the Limits of Rotating Cylindrical Magnetron Sputtering", Magnetron, ION Processing and ARC Technologies European Conference, Jun. 18, 2010, pp. 1-32.
Collins English Dictionary (Convex. (2000). In Collins English Dictionary. http://search.credoreference.com/content/entry/hcengdict/convex/0 on Oct. 18, 2014).
Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.
Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.
JCS Pires, J Otubo, AFB Braga, PR Mei; The purification of metallurgical grade silicon by electron beam melting, J of Mats Process Tech 169 (2005) 16-20.
Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.
Merriam-Webster online dictionary—"mesh". (accessed Oct. 8, 2012).
Mueller, Thomas, et al. "Application of wide-band gap hydrogenated amorphous silicon oxide layers to heterojunction solar cells

(56) References Cited

OTHER PUBLICATIONS for high quality passivation." Photovoltaic Specialists Conference, 2008. PVSC'08. 33rd IEEE. IEEE, 2008.

Mueller, Thomas, et al. "High quality passivation for heterojunction solar cells by hydrogenated amorphous silicon suboxide films." Applied Physics Letters 92.3 (2008): 033504-033504.

Munzer, K.A. "High Throughput Industrial In-Line Boron BSF Diffusion" Jun. 2005. 20th European Photovoltaic Solar Energy Conference, pp. 777-780.

O'Mara, W.C.; Herring, R.B.; Hunt L.P. (1990). Handbook of Semiconductor Silicon Technology. William Andrew Publishing/Noyes. pp. 275-293.

Stangl et al., Amorphous/Crystalline Silicon heterojunction solar cells—a simulation study; 17th European Photovoltaic Conference, Munich, Oct. 2001.

Chabal, Yves J. et al., 'Silicon Surface and Interface Issues for Nanoelectronics,' The Electrochemical Society Interface, Spring 2005, pp. 31-33.

Parthavi, "Doping by Diffusion and Implantation", <http://www.leb.eei.uni-erlangen.de/winterakademie/2010/report/course03/pdf/0306.pdf>.

Weiss, "Development of different copper seed layers with respect to the copper electroplating process," Microelectronic Engineering 50 (2000) 443-440, Mar. 15, 2000.

Tomasi, "Back-contacted Silicon Heterojunction Solar Cells With Efficiency>21%" 2014 IEEE.

Hornbachner et al., "Cambered Photovoltaic Module and Method for its Manufacture" Jun. 17, 2009.

\* cited by examiner

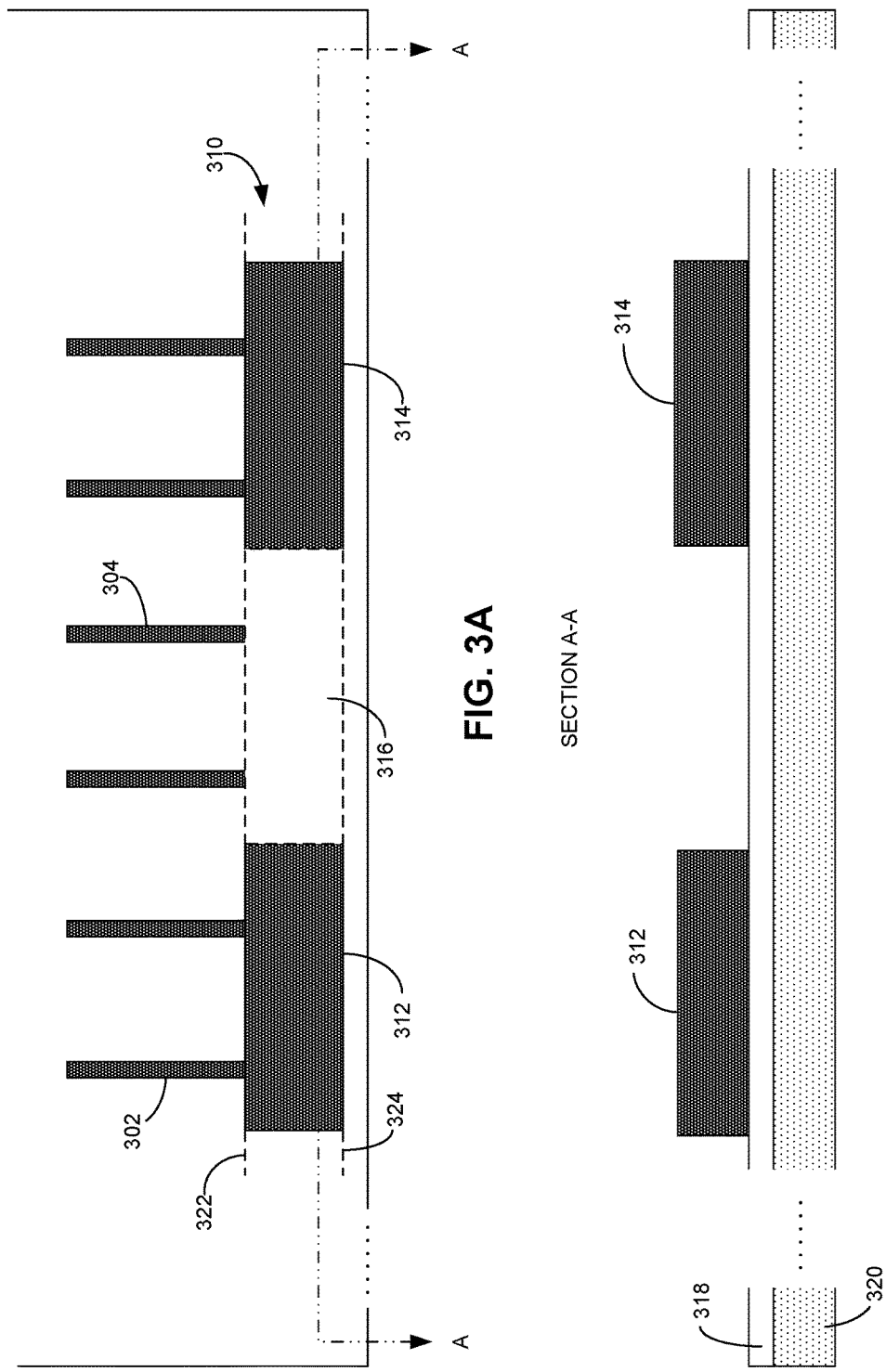

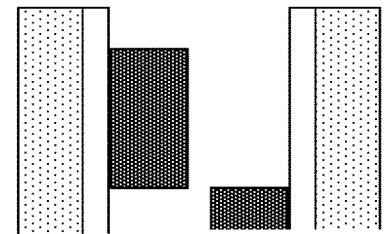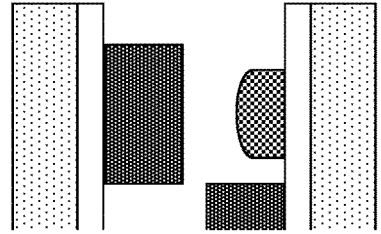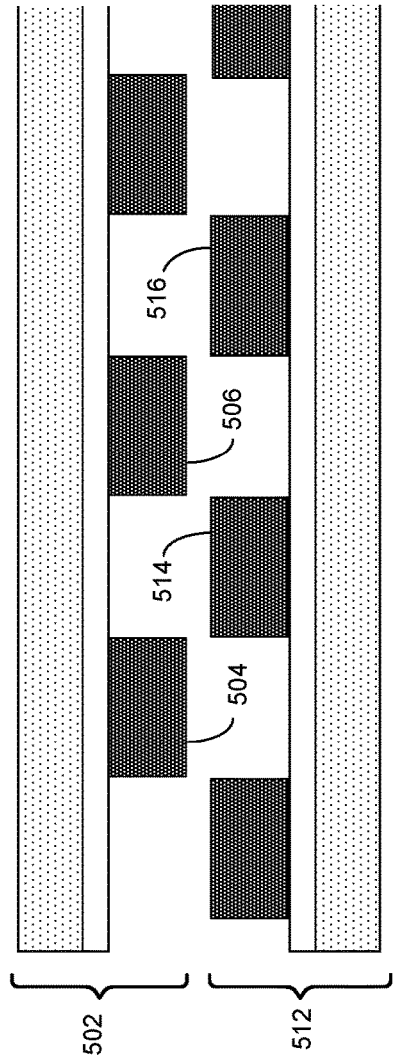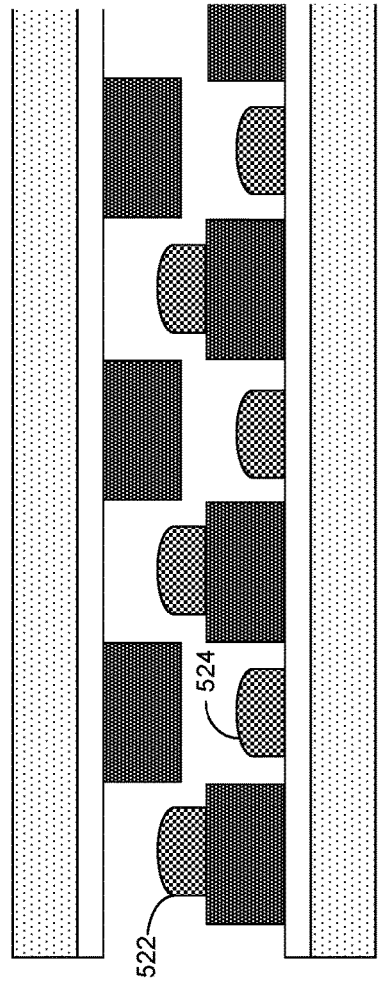
FIG. 5A
FIG. 5B

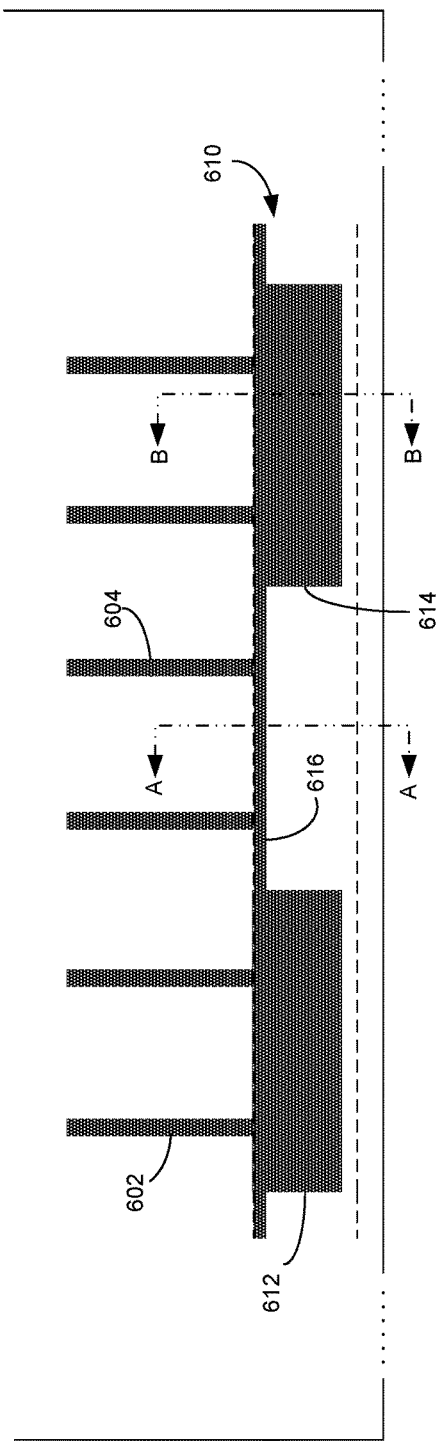
FIG. 6A
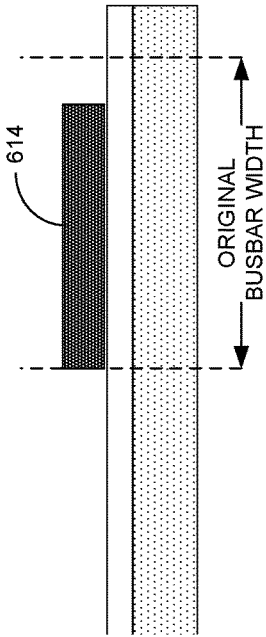
FIG. 6B
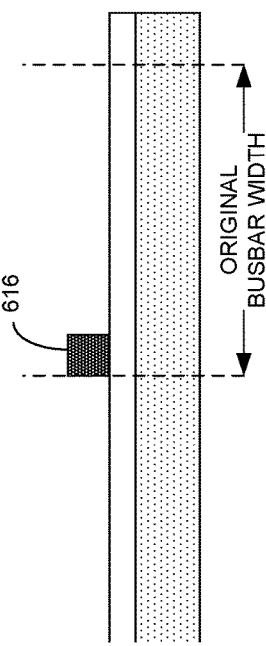

SECTION A-A

PHOTOVOLTAIC STRUCTURES WITH INTERLOCKING BUSBARS

FIELD OF THE INVENTION

This generally relates to the electrode design for photovoltaic structures. More specifically, this disclosure is related to photovoltaic structures having interlocking busbars.

Definitions

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of strips may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a "string."

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Advances in photovoltaic technology, which is used to make solar panels, have helped solar energy gain mass appeal among those wishing to reduce their carbon footprint and decrease their monthly energy costs. However, the panels are typically fabricated manually, which is a time-consuming and error-prone process. This makes it costly to mass-produce reliable solar panels.

Solar panels typically include one or more strings of complete solar cells. Adjacent solar cells in a string may overlap one another in a cascading arrangement. For example, continuous strings of solar cells that form a solar panel are described in U.S. patent application Ser. No. 14/510,008, filed Oct. 8, 2014, and entitled "Module Fabrication of Solar Cells with Low Resistivity Electrodes," the disclosure of which is incorporated herein by reference in its entirety. Producing solar panels with a cascaded cell arrangement can reduce the resistance due to interconnections between the strips, and can increase the number of solar cells that can fit into a solar panel.

Fabrications of such cascaded panels can involve overlapping edges of adjacent cells in such a way that the electrodes (busbars) on opposite sides of the overlapped cells are in contact to establish an electrical connection. This process is repeated for a number of successive cells until one string of cascaded cells is created. A number of strings are then coupled to each other (either in series or in parallel) and placed in a protective frame. To further reduce internal resistance of the entire panel and to ensure that the manufactured panel is compatible with conventional panels, one form of the cascaded panel (as described in the aforementioned patent application) can include a series of solar cell strips created by dividing complete solar cells into smaller pieces (i.e., the strips). These smaller strips can then be cascaded (edge overlapped) to form a string. Proper mechanical bonding and electrical coupling between busbars of adjacent strips are needed.

SUMMARY

One embodiment can provide a current-collecting mechanism of a photovoltaic structure. The current-collecting mechanism can include a top metallic grid positioned on a top surface of the photovoltaic structure and a bottom metallic grid positioned on the bottom surface of the photovoltaic structure. The top metallic grid can include a top busbar positioned near an edge of the photovoltaic structure, and the bottom metallic grid can include a bottom busbar positioned near an opposite edge. The top busbar and the bottom busbar can have complementary topology profiles such that, when the edge of the photovoltaic structure overlaps with an opposite edge of an adjacent photovoltaic structure, the top busbar of the photovoltaic structure and the bottom busbar of the adjacent photovoltaic structure interlock with each other.

In some embodiments, the busbars can include discontinued segments of a metallic strip.

In some embodiments, segments of the busbars and spacing between adjacent segments can have equal length.

In some embodiments, the busbars can include segments of a metallic strip of a wider width, and adjacent segments can be connected to each other by a metallic strip of a narrower width. The top busbar of the photovoltaic structure and the bottom busbar of the adjacent photovoltaic structure can interlock with each other in an interdigitated way.

In some embodiments, the metallic grids each can include a plurality of finger lines. All of the finger lines can be connected either to a segment or to the narrower metallic strip.

In some embodiments, the metallic grids can include an electroplated Cu layer.

In some embodiments, the current-collecting mechanism can further include a layer of conductive paste, which can be configured to bond the top busbar of the photovoltaic structure to a portion of the bottom surface of the adjacent photovoltaic structure not covered by its bottom busbar.

BRIEF DESCRIPTION OF THE FIGURES

FIG. 3A shows a partial top view of a strip, according to an embodiment.

FIG. 3B shows the partial cross-sectional view of the strip, according to an embodiment.

FIG. 5A shows the cross-sectional view of two adjacent strips with edge busbars aligned, according to an embodiment.

FIG. 5B shows a cross-sectional view of the two edge-busbar-aligned strips with conductive paste applied, according to an embodiment.

FIG. 6A shows a partial top view of a strip, according to an embodiment.

FIG. 6B shows partial cross-sectional views of the strip, according to an embodiment.

In the figures, like reference numerals refer to the same figure elements.

DETAILED DESCRIPTION

Figure 1A:
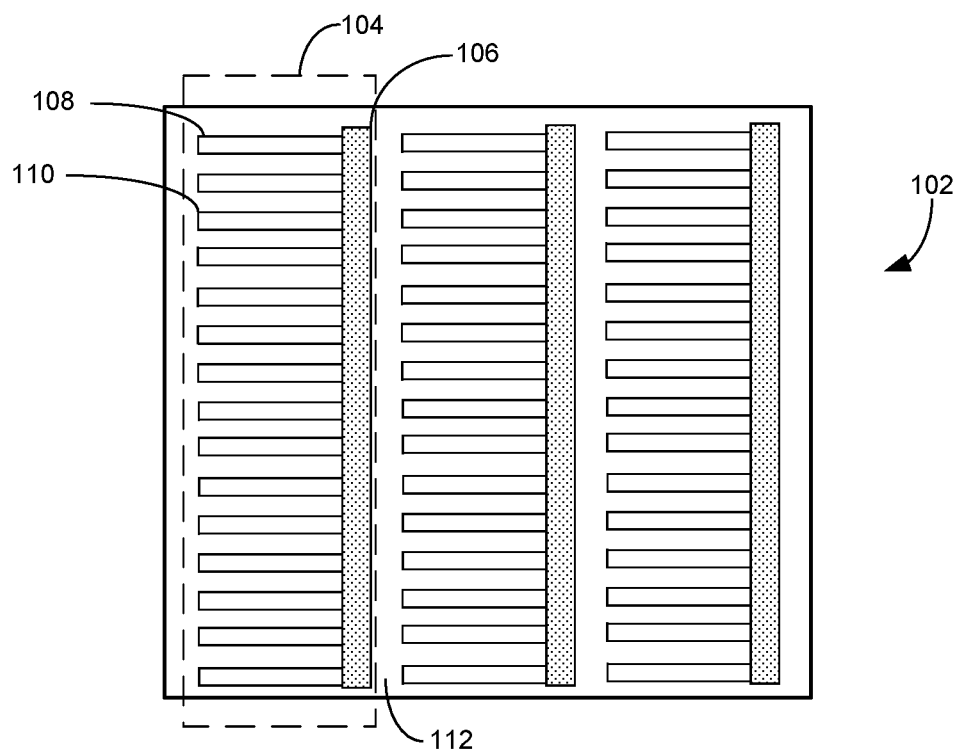
FIG. 1A shows an exemplary grid pattern on the front surface of a photovoltaic structure.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention can provide a photovoltaic structure that can include specially designed electrodes to ensure proper electrical and mechanical coupling between adjacent photovoltaic structures. More specifically, the two edge busbars positioned on opposite sides of a photovoltaic structure can have complementary topology patterns. This way, when two adjacent photovoltaic structures are partially overlapped at one edge, their overlapping busbars interlock with each other. Conductive paste can also be applied between the interlocking busbars to strengthen both the electrical and mechanical coupling.

Solar Panel Based on Cascaded Strips

As described in U.S. patent application Ser. No. 14/563,867, a solar panel can have multiple (e.g., three) strings, each string including cascaded strips, connected in parallel. Such a multiple-parallel-string panel configuration provides the same output voltage with a reduced internal resistance. In general, a cell can be divided into n strips, and a panel can contain n strings. Each string can have the same number of strips as the number of regular photovoltaic structures in a conventional single-string panel. Such a configuration can ensure that each string outputs approximately the same voltage as a conventional panel. The n strings can then be connected in parallel to form a panel. As a result, the panel's voltage output can be the same as that of the conventional single-string panel, while the panel's total internal resistance can be 1/n of the resistance of a string. Therefore, in general, a greater n can lead to a lower total internal resistance and, hence, more power extracted from the panel. However, a tradeoff is that as n increases, the number of connections required to interconnect the strings also increases, which increases the amount of contact resistance. Also, the greater n is, the more strips a single cell needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance, the greater n might need to be to effectively reduce the panel's overall internal resistance. Therefore, the type of electrode can dictate the number of strips. For example, conventional silver-paste or aluminum-based electrodes typically cannot produce ideal resistance between the electrode and underlying photovoltaic structure. As a result, such electrodes may require n to be greater than four. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed-silver-paste electrode. Consequently, a smaller n can be used to attain the benefit of reduced panel internal resistance. In some embodiments, n can be selected to be three, which is less than the n value generally needed for cells with silver-paste electrodes or other types of electrodes. Correspondingly, two grooves can be scribed on a single cell to allow the cell to be divided into three strips.

In addition to lower contact resistance, electroplated copper electrodes can also offer better tolerance to microcracks, which may occur during a cleaving process. Such microcracks might adversely impact silver-paste-electrode cells. Plated-copper electrodes, on the other hand, can preserve the conductivity across the cell surface even if there are microcracks in the photovoltaic structure. The copper electrode's higher tolerance for microcracks can allow one to use thinner silicon wafers to manufacture cells. As a result, the grooves to be scribed on a cell can be shallower than the grooves scribed on a thicker wafer, which in turn can help increase the throughput of the scribing process. More details on using copper plating to form low-resistance electrodes on a photovoltaic structure are provided in U.S. patent application Ser. No. 13/220,532, entitled "SOLAR CELL WITH ELECTROPLATED GRID," filed Aug. 29, 2011, the disclosure of which is incorporated herein by reference in its entirety.

FIG. 1A shows an exemplary grid pattern on the front surface of a photovoltaic structure. In the example shown in FIG. 1A, grid 102 can include three sub-grids, such as sub-grid 104. This three sub-grid configuration can allow the photovoltaic structure to be divided into three strips. To enable cascading, each sub-grid can have an edge busbar, which can be located either at or near the edge. In the example shown in FIG. 1A, each sub-grid can include an edge busbar ("edge" here refers to the edge of a respective strip) running along the longer edge of the corresponding strip and a plurality of parallel finger lines running in a direction parallel to the shorter edge of the strip. For example, sub-grid 104 can include edge busbar 106, and a plurality of finger lines, such as finger lines 108 and 110. To facilitate the subsequent laser-assisted scribe-and-cleave process, a predefined blank space (i.e., space not covered by electrodes) can be inserted between the adjacent sub-grids. For example, blank space 112 can be defined to separate sub-grid 104 from its adjacent sub-grid. In some embodiments, the width of the blank space, such as blank space 112, can be between 0.1 mm and 5 mm, preferably between 0.5 mm and 2 mm. There is a tradeoff between a wider space that leads to a more tolerant scribing operation and a narrower space that leads to more effective current collection. In a further embodiment, the width of such a blank space can be approximately 1 mm.

Figure 1B:
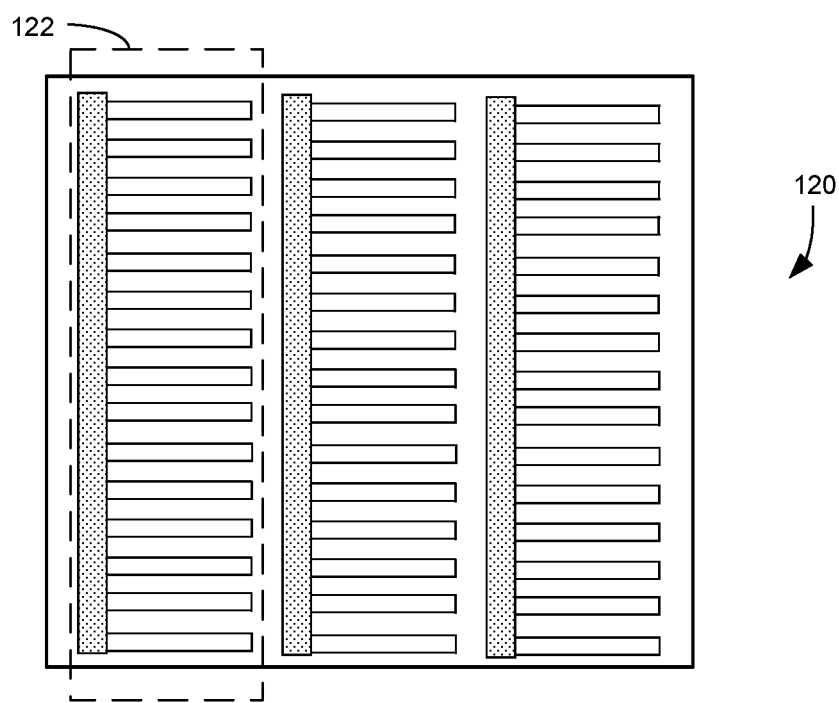
FIG. 1B shows an exemplary grid pattern on the back surface of a photovoltaic structure.

FIG. 1B shows an exemplary grid pattern on the back surface of a photovoltaic structure. When showing the back surface, for illustration purposes, the photovoltaic structure is assumed to be transparent. The grid patterns on the front and back surfaces of the photovoltaic structure are viewed from the same viewing point. In the example shown in FIG. 1B, back grid 120 can include three sub-grids, such as sub-grid 122. To enable cascaded and bifacial operation, the back sub-grid may correspond to the front sub-grid. More specifically, the back edge busbar can be located at the opposite edge of the frontside edge busbar. In the examples shown in FIGS. 1A and 1B, the front and back sub-grids can have similar patterns except that the front and back edge busbars are located adjacent to opposite edges of the strip. In addition, locations of the blank spaces in back conductive grid 120 can correspond to locations of the blank spaces in front conductive grid 102, such that the grid lines do not interfere with the subsequent scribe-and-cleave process. In practice, the finger line patterns on the front and back sides of the photovoltaic structure may be the same or different.

In the examples shown in FIGS. 1A and 1B, the finger line patterns can include continuous, non-broken loops. For example, as shown in FIG. 1A, finger lines 108 and 110 can both include connected loops. This type of "looped" finger line pattern can reduce the likelihood of the finger lines peeling away from the photovoltaic structure after long use. Optionally, the sections where parallel lines are joined can be wider than the rest of the finger lines to provide more durability and prevent peeling. Patterns other than the one shown in FIGS. 1A and 1B, such as un-looped straight lines or loops with different shapes, are also possible.

To form a cascaded string, cells or strips (e.g., as a result of a scribing-and-cleaving process applied to a regular square cell) can be cascaded with their edges overlapped.

Figure 2A:
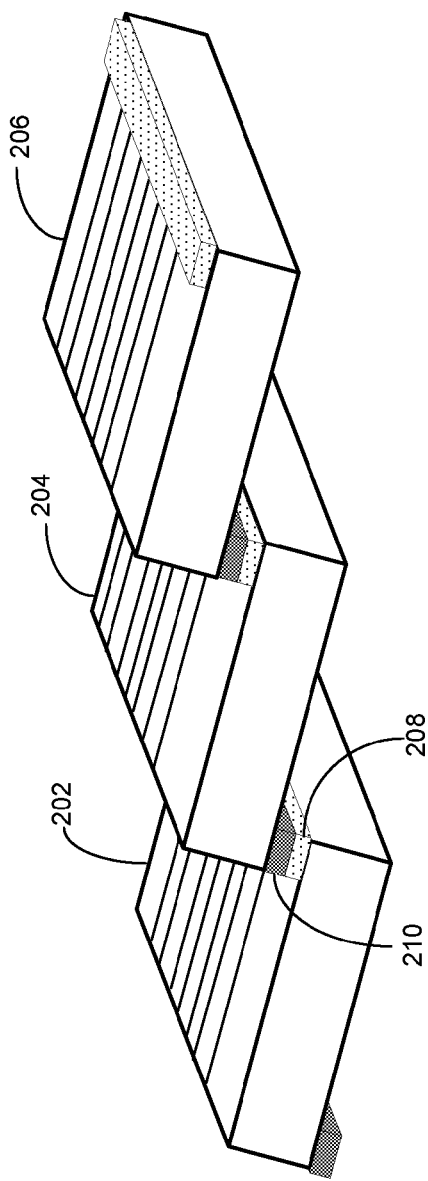
FIG. 2A shows a string of cascaded strips.

FIG. 2A shows a string of cascaded strips. In FIG. 2A, strips 202, 204, and 206 can be stacked in such a way that strip 206 can partially overlap adjacent strip 204, which can also partially overlap (on an opposite edge) strip 202. Such a string of strips can form a pattern that is similar to roof shingles. Each strip can include top and bottom edge busbars located at opposite edges of the top and bottom surfaces, respectively. Strips 202 and 204 may be coupled to each other via an edge busbar 208 located at the top surface of strip 202 and an edge busbar 210 located at the bottom surface of strip 204. To establish electrical coupling, strips 202 and 204 can be placed in such a way that bottom edge busbar 210 is placed on top of and in direct contact with top edge busbar 208.

Figure 2B:
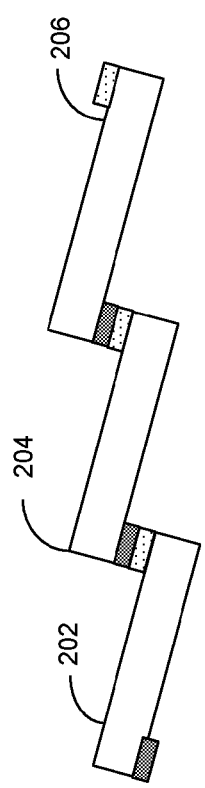
FIG. 2B shows a side view of the string of cascaded strips.

FIG. 2B shows a side view of the string of cascaded strips. In the example shown in FIGS. 2A and 2B, the strips can be part of a 6-inch square photovoltaic structure, with each strip having a dimension of approximately 2 inches by 6 inches. To reduce shading, the overlapping between adjacent strips should be kept as small as possible. In some embodiments, the single busbars (both at the top and the bottom surfaces) can be placed at the very edge of the strip (as shown in FIGS. 2A and 2B). The same cascaded pattern can extend along an entire row of strips to form a serially connected string.

Interlocking Busbars

When forming a solar panel, adjacent strips may be bonded together via edge busbars. Such bonding can be important to ensure that the electrical connections are well maintained when the solar panel is put into service. One option for bonding the metallic busbars can include soldering. For example, the surface of the edge busbars may be coated with a thin layer of Sn. During a subsequent lamination process, heat and pressure can be applied to cure sealant material between photovoltaic structures and the front and back covers of the solar panel. The same heat and pressure can also solder together the edge busbars that are in contact, such as edge busbars 208 and 210. However, the rigid bonding between the soldered contacts may lead to cracking of the thin strips. Moreover, when in service solar panels often experience many temperature cycles, and the thermal mismatch between the metal and the semiconductor may create structural stress that can lead to fracturing.

To reduce the thermal or mechanical stress, it can be preferable to use a bonding mechanism that is sufficiently flexible and can withstand many temperature cycles. One way to do so is to bond the strips using flexible adhesive that is electrically conductive. For example, adhesive (or paste) can be applied on the surface of top edge busbar 208 of strip 202 (shown in FIG. 2A). When strip 204 is placed to partially overlap with strip 202, bottom edge busbar 210 can be bonded to top edge busbar 208 by the adhesive, which can be cured at an elevated temperature. Different types of conductive adhesive or paste can be used to bond the busbars. In one embodiment, the conductive paste can include a conductive metallic core surrounded by a resin. When the paste is applied to a busbar, the metallic core establishes an electrical connection with the busbar while the resin that surrounds the metallic core functions as an adhesive. In another embodiment, the conductive adhesive may be in the form of a resin that includes a number of suspended conductive particles, such as Ag or Cu particles. The conductive particles may be coated with a protective layer. When the paste is thermally cured, the protective layer can evaporate to enable electrical conductivity between the conductive particles suspended inside the resin.

Even with the application of the conductive paste, the thermal mismatch between the metallic busbar and the underlying semiconductor can still be problematic. For example, the thermal expansion coefficient of Cu is much larger than that of Si, meaning that Cu expands and contracts more than Si when temperature changes. Because the busbars have a larger interface, the accumulated thermal stress can have a larger impact on the busbars.

To reduce thermal stress, in some embodiments, instead of a continuous metallic strip, the busbar may be segmented. FIG. 3A shows a partial top view of a strip, according to an embodiment. FIG. 3B shows the partial cross-sectional view of the strip, according to an embodiment. More specifically, FIG. 3B shows the sectional view along cut plane A-A, indicated by dashed arrows shown in FIG. 3A. Plane A-A cuts through the middle of the busbar in a direction that is along the length of the busbar.

FIG. 3A shows that the top surface of a photovoltaic structure can include a busbar (e.g., busbar 310) and a number of finger lines (e.g., finger lines 302 and 304). Busbar 310 can include a number of discontinued segments, such as segments 312 and 314, each segment being a metallic column or block of a certain height. Adjacent segments of the busbar can be separated by an empty space (e.g., space 316). In FIG. 3A, dashed lines 322 and 324 outline the conventional continuous busbar, which can now be replaced by segmented busbar 310.

FIG. 3B shows the profile of busbar 310 as well as the layer structure of the photovoltaic structure, which can include, in addition to the metallic grid, transparent conductive oxide (TCO) layer 318, and photovoltaic body 320. Photovoltaic body 320 often can include a Si base layer and an emitter layer. Photovoltaic body 320 can optionally include other layers that can enhance the energy-conversion efficiency, such as quantum-tunneling barrier (QTB) layers and surface field layers. The scope of the instant application cannot be limited by the specific structure of photovoltaic body 320.

In some embodiments, the segments (e.g., segments 312 and 314) of busbar 310 can be of the same size. In the example shown in FIGS. 3A and 3B, each segment has the same width as that of the conventional busbar, and can also have the same length. The length of each segment can be between 1 and 10 mm. Compared to a conventional continuous busbar, which can be about 150 mm long for 6-inch wafers, the shorter segments in the segmented busbar each can experience less thermal stress. More specifically, the empty space between adjacent busbar segments allows the thermal stress built within each segment to be released. In some embodiments, the empty space between adjacent segments can have the same length as each segment. For example, the spacing between segments 312 and 314 can be of the same length as segment 312 or 314. Alternatively, the segments, as well as the spacing between the segments, can have different lengths.

Figure 4A:
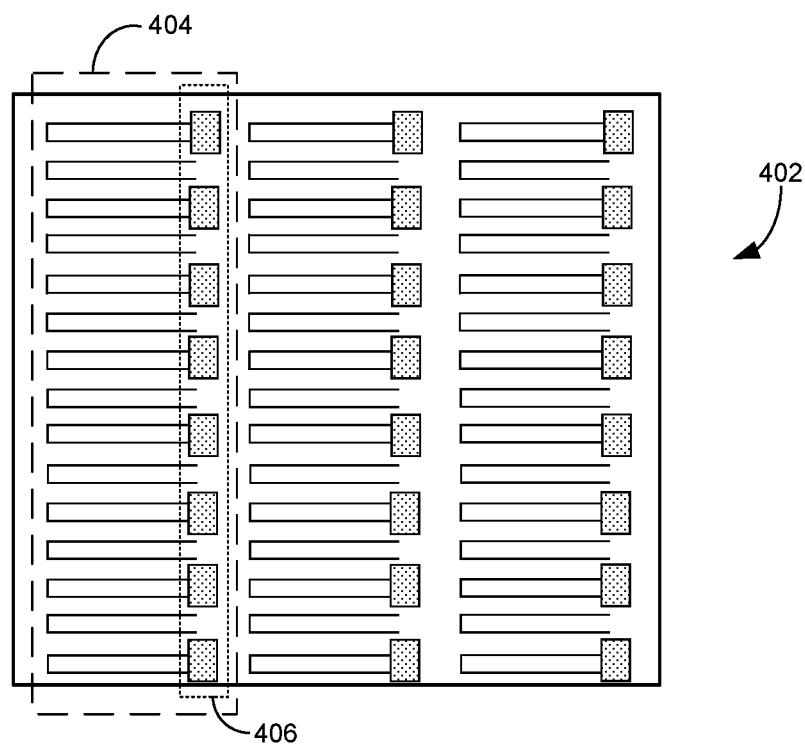
FIG. 4A shows an exemplary grid pattern on the front surface of a photovoltaic structure, according to an embodiment.

FIG. 4A shows an exemplary grid pattern on the front surface of a photovoltaic structure, according to an embodiment. Similar to grid 102 shown in FIG. 1A, grid 402 shown in FIG. 4A can include a number of sub-grids, such as sub-grid 404. Each sub-grid can include a segmented busbar and a number of finger lines. For example, sub-grid 404 can include segmented busbar 406, which can include a number of discontinued segments.

Figure 4B:
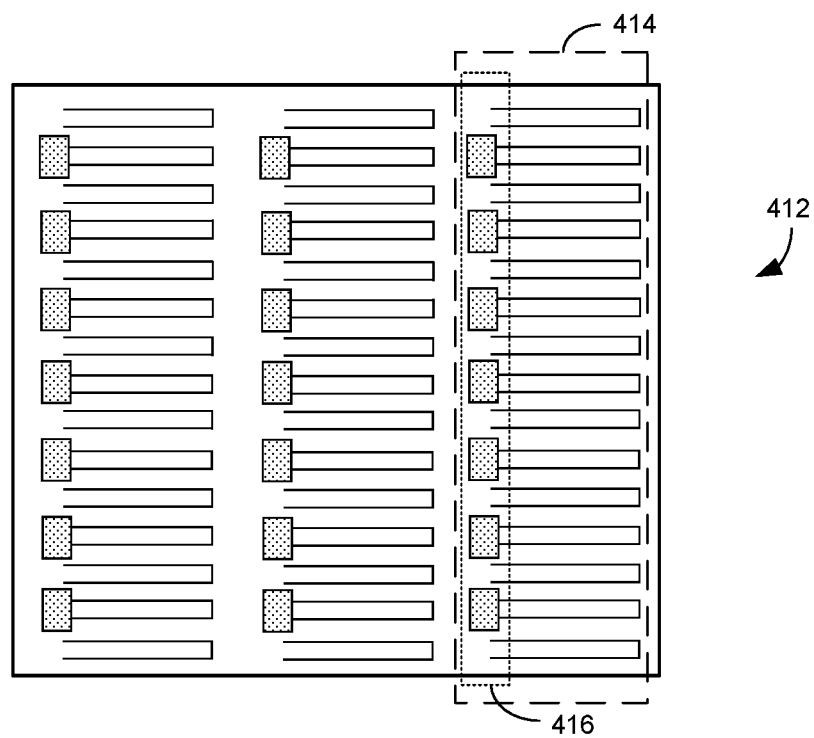
FIG. 4B shows an exemplary grid pattern on the back surface of a photovoltaic structure, according to an embodiment.

FIG. 4B shows an exemplary grid pattern on the back surface of a photovoltaic structure, according to an embodiment. Similar to grid 402 shown in FIG. 4A, grid 412 can include a number of sub-grids, such as sub-grid 414. Each sub-grid can include a segmented busbar and a number of finger lines. For example, sub-grid 414 can include segmented busbar 416, which can include a number of discontinued segments.

From FIGS. 4A and 4B, one can see that the sub-grids on the front and back surfaces of a same strip appear to be similar, except that their busbars are positioned on opposite edges. For example, in grid 402, the busbar of each sub-grid is positioned at the right edge of each sub-grid, whereas in grid 412, the busbar of each sub-grid is positioned at the left edge of each sub-grid. The positions of the busbars are similar to the ones shown in FIG. 2A. In addition to the different locations, the segmented busbars on the top and bottom surfaces of the photovoltaic structure also differ in the way they are patterned. More specifically, the top segmented busbar (e.g., busbar 406) and the bottom segmented busbar (e.g., busbar 416) can be patterned in ways that complement each other, such that when a strip is edge overlapped with an adjacent strip, the busbars on the respective edges can overlap and interlock with each other.

FIG. 5A shows a cross-sectional view of two adjacent strips with edge busbars aligned, according to an embodiment. The bottom segmented busbar of top strip 502 can include a number of segments (e.g., segments 504 and 506), and the top segmented busbar of bottom strip 512 can include a number of segments (e.g., segments 514 and 516). The topology profiles of the bottom segmented busbar and the top segmented busbar complement each other, meaning that at locations where the bottom segmented busbar has a metallic segment there is a void in the top segmented busbar, and vice versa. Such a void can expose the underlying layer, which can be a TCO layer. In FIG. 5A, the void between segments 504 and 506 of the bottom segmented busbar of strip 502 can correspond to segment 514 of the top segmented busbar of strip 512. Similarly, the void between segments 514 and 516 of the top segmented busbar of strip 512 can correspond to segment 506 of the bottom segmented busbar of strip 502. This way, these two segmented busbars can interlock with each other when one is placed on the top of the other, forming a continuous conductor. More specifically, segments of the top busbar can fit into voids of the bottom busbar, and vice versa. For example, segment 506 of the top busbar can snuggly fit into the void between segments 514 and 516 of the bottom busbar. Similarly, segment 514 of the bottom busbar can snuggly fit into the void between segments 504 and 506.

Although the interlocked busbars can provide a certain level of electrical coupling and mechanical bonding, conductive paste can still be applied to ensure reliability. FIG. 5B shows the cross-sectional view of the two edge-busbar-aligned strips with conductive paste applied, according to an embodiment. Conductive paste droplets (e.g., droplets 522 and 524) can be applied on the bottom segmented busbar, with some deposited on the metallic segments and some on the voids. For example, droplet 522 is deposited on a metallic segment, whereas droplet 524 is deposited within a void.

Various techniques can be used to deposit the conductive paste, including manual paste application and automatic paste application. For large-scale manufacturing of solar panels, an automated paste-dispensing system can be used to precisely dispense the paste onto the busbars. A detailed description of an automated paste-dispensing system can be found in U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015, the disclosure of which is incorporated herein by reference in its entirety.

Figure 5C:
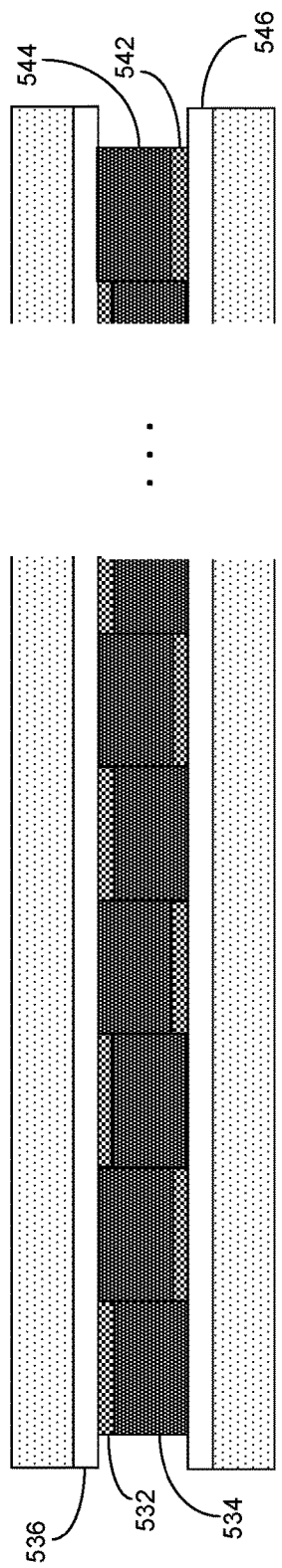
FIG. 5C shows the cross-sectional view of the two adjacent strips with overlapping edge busbars, according to an embodiment.

FIG. 5C shows the cross-sectional view of the two adjacent strips with overlapping edge busbars, according to an embodiment. In FIG. 5C, the edge busbars of the two adjacent strips interlock with each other, and the conductive paste can bind segments of one busbar to the exposed surface (which can be a TCO surface) of the other strip. For example, conductive paste 532 can bind metallic segment 534 of the bottom strip to TCO layer 536 of the top strip. Similarly, conductive paste 542 can bind metallic segment 544 of the top strip to TCO layer 546 of the bottom strip.

Figure 5D:
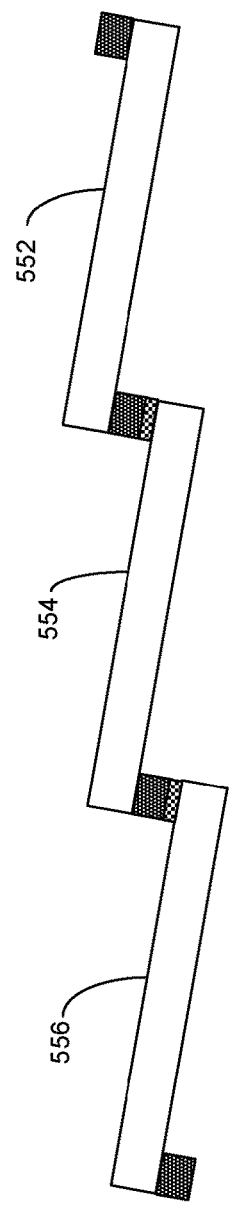
FIG. 5D shows a side view of a string of cascaded strips, according to an embodiment.

FIG. 5D shows a side view of a string of cascaded strips, according to an embodiment. Strips 552, 554, and 556 can be stacked in such a way that an edge of strip 552 can overlap with an edge of adjacent strip 554, and the opposite edge of strip 554 can overlap with an edge of strip 556. More specifically, the bottom edge busbar of strip 552 can be placed on and interlock with the top edge busbar of strip 554, and the bottom edge busbar of strip 554 can be placed on and interlock with the top edge busbar of strip 556.

Compared to the example shown in FIGS. 2A and 2B where the two continuous edge busbars are placed with one on top of the other, the interlocking busbars shown in FIGS. 5A-5D can provide a number of advantages, including strengthened mechanical bonding and reduced series resistance.

The segmented busbar design can reduce the stress resulting from the thermal mismatch between the metallic material and the semiconductor material. In addition, as shown in FIG. 5C, conductive paste can be used to bind segments of the busbar to the TCO layer of the other strip. The bonding between the conductive paste and the TCO material can typically be stronger than the bonding between the plated metallic layer and the TCO material. Therefore, the mechanical bonding between two partially overlapped strips shown in FIGS. 5C and 5D can be much stronger than the one shown in FIGS. 2A and 2B, where the bonding is provided by the overlapped busbars. Because the two busbars are now interlocked with each other, the distance traveled by the photo-generated current from one strip to the next can be cut by almost half, while the overall cross-section of the busbar remains the same. This can, in turn, reduce the overall series resistance of the inter-cell connections. Although it may be possible to reduce the height of the busbars to reduce the series resistance of the inter-cell connections, such an approach can also result in the height reduction of the finger lines, which can lead either to more shading or to increased series resistance of the finger lines.

In some embodiments, the metallic grid (including the busbar and finger lines) can be formed using a plating technique. More specifically, electroplated Cu grids can provide lower series resistance and higher tolerance for microcracks within the Si-based photovoltaic structures. During electroplating, a photovoltaic structure can be submerged in an electrolyte bath. A plating mask covering the surface of the photovoltaic structure can be used to define where metallic ions are deposited. Because the metallic ions are deposited as a result of the electric field set up in the plating bath, to ensure uniform deposition, the electric field distribution should be uniform. In the segmented busbar design, there are isolated islands of metallic segments (e.g., segments 312 and 314 shown in FIGS. 3A and 3B). This can lead to locally increased current density, making it difficult to obtain uniform material deposition, especially at locations of the finger lines that are not connected to any busbar segments. To overcome this problem, in some embodiments, instead of having discontinued segments, the busbar segments can be connected by a thin metal strip.

FIG. 6A shows a partial top view of a strip, according to an embodiment. FIG. 6B shows partial cross-sectional views of the strip, according to an embodiment. More specifically, FIG. 6B shows the sectional view along cut planes A-A and B-B, indicated by dashed arrows shown in FIG. 6A.

FIG. 6A also shows that the top surface of a photovoltaic structure can include a busbar (e.g., busbar 610) and a number of finger lines (e.g., finger lines 602 and 604). Busbar 610 can be similar to busbar 310 shown in FIG. 3A, except that busbar 310 includes a number of discontinued segments, whereas busbar 610 includes a number of segments (e.g., segments 612 and 614) that are connected to each other by a metallic strip (e.g., metallic strip 616). The cross-sectional views of the strip shown in FIG. 6B demonstrate the layer structure of the photovoltaic structure and the topology profile of the busbar along the specified cut planes.

The left-hand drawing of FIG. 6B shows the sectional view along cut plane A-A, illustrating the profile of metallic strip 616. The width of metallic strip 616 can be a small fraction of the width of an original busbar (e.g., the conventional continuous busbar). This is important, because the empty space between the adjacent segments allows the thermal stress to be released. On the other hand, metallic strip 616 allows the otherwise isolated finger lines (e.g., finger line 604) to be connected to larger metallic segments, thus ensuring a uniform distribution of the electrical field during electroplating. In some embodiments, the width of metallic strip 616 can be between $1/10$ and $1/4$ of the width of an original busbar. For example, the width of metallic strip 616 can be between 80 and 300 microns.

The right-hand drawing of FIG. 6B shows the sectional view along cut plane B-B, illustrating the profile of the metallic segments (i.e., metallic segment 614). Unlike the example shown in FIG. 3A where the width of the metallic segments is the same as an original busbar, the width of the metallic segments shown in FIGS. 6A and 6B is less than the width of an original busbar. In some embodiments, the width of the metallic segments can be between $3/4$ and 90% of the width of the original busbar. In further embodiments, the sum of the width of metallic strip 616 and the width of metallic segment 614 can be the width of the original busbar.

Figure 7A:
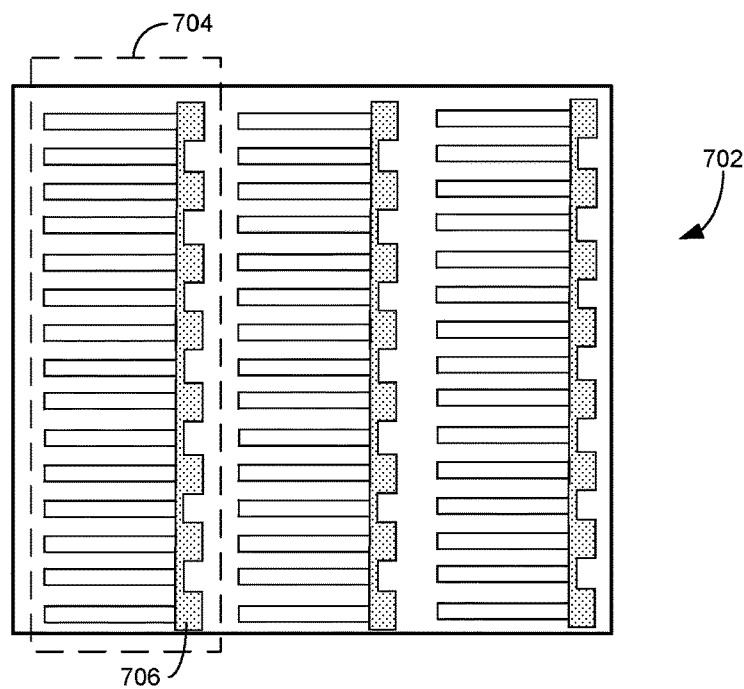
FIGS. 7A and 7B show exemplary grid patterns on the front and back surfaces, respectively, of a photovoltaic structure, according to an embodiment.
Figure 7B:
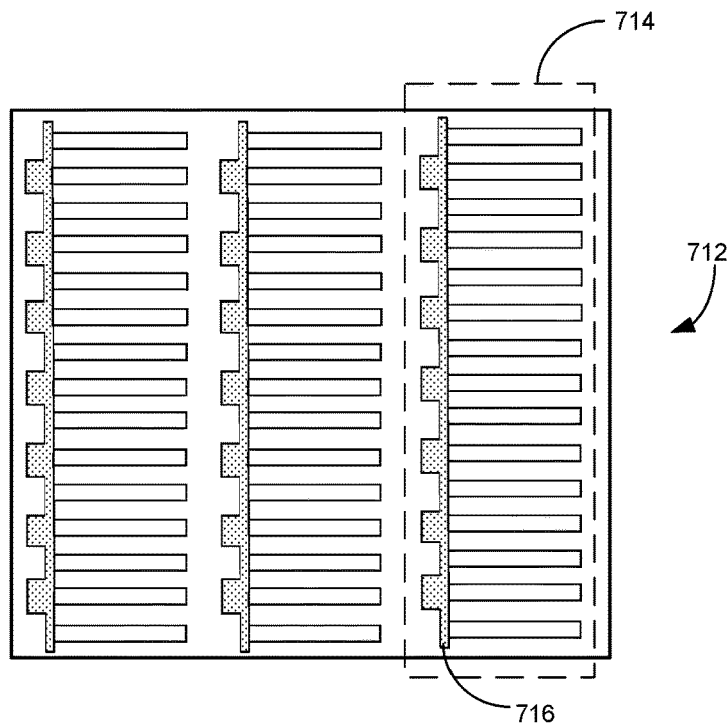

FIGS. 7A and 7B show exemplary grid patterns on the front and back surfaces, respectively, of a photovoltaic structure, according to an embodiment. Metallic grid 702 can be similar to metallic grid 402 shown in FIG. 4A, and metallic grid 712 can be similar to metallic grid 412 shown in FIG. 4B, except that instead of discontinued segments, each sub-grid of metallic grids 702 and 712 can include segments that are connected by thin metallic strips. For example, sub-grid 704 of grid 702 can include a busbar 706, and sub-grid 714 of grid 712 can include a busbar 716. Busbars 706 and 716 are located at opposite edges of their respective sub-grids to allow cascading of adjacent strips. More specifically, the shape of the busbar on the front surface of the photovoltaic structure and the shape of the busbar on the back surface of the photovoltaic structure can complement each other, such that when a strip is partially overlapped with an adjacent strip, the two busbars can interlock with each other to form a combined busbar.

Figure 7C:
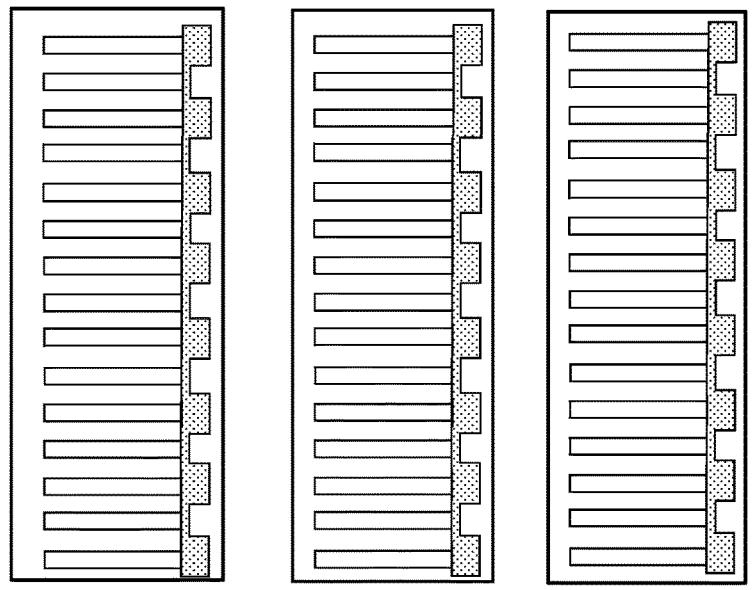
FIGS. 7C and 7D show the front and back surfaces, respectively, of divided solar cell strips, according to an embodiment.
Figure 7D:
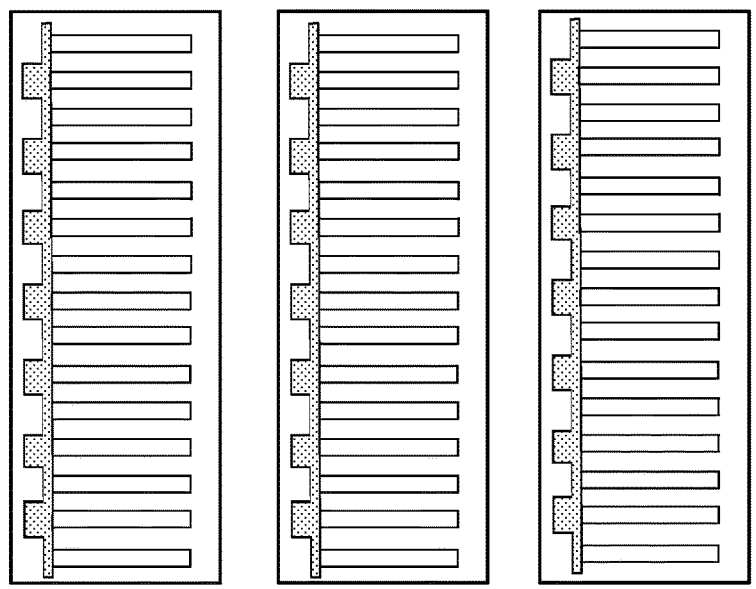

FIGS. 7C and 7D show the front and back surfaces, respectively, of divided solar cell strips, according to an embodiment. When showing the back surface of a strip, for illustration purposes, the strip can be assumed to be transparent. In FIGS. 7C and 7D, the grid patterns on the front and back surfaces are viewed from the same viewpoint.

Figure 7E:
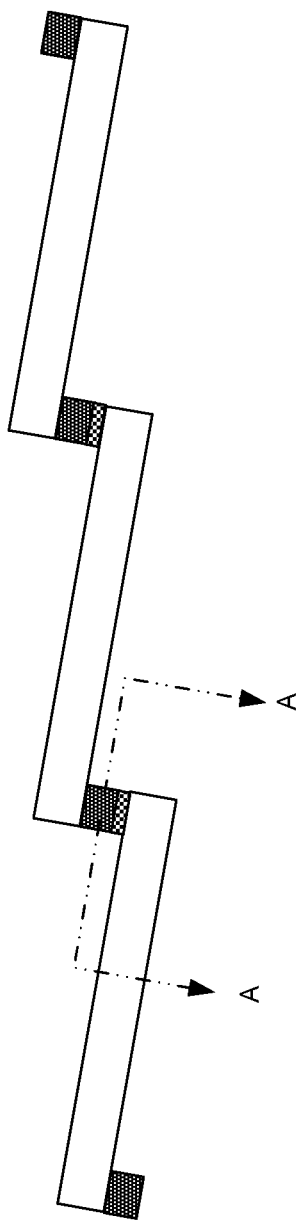
FIG. 7E shows the side view of a string of cascaded strips, according to an embodiment.

FIG. 7E shows the side view of a string of cascaded strips, according to an embodiment. Similar to the example shown in FIG. 5D, in FIG. 7E, a number of strips can be stacked in such a way that one edge of a strip can overlap with an edge of an adjacent strip, and the opposite edge of the same strip can overlap with another adjacent strip. Also similar to the example shown in FIGS. 5B and 5C, conductive paste can be used to bond the two interlocking busbars and to bond each busbar to the other strip. Such bonding can be stronger than the conventional bonding provided by the busbars.

Figure 7F:
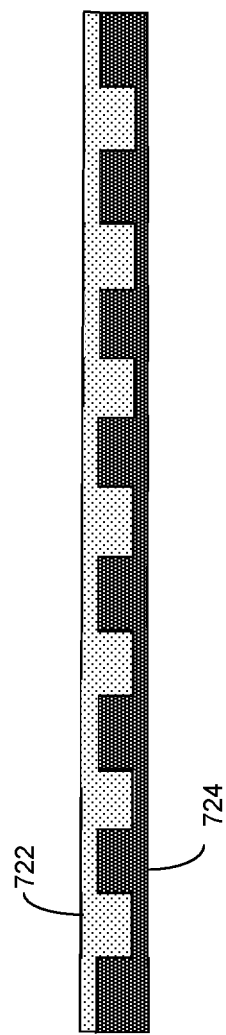
FIG. 7F shows the cross-sectional view of the bonded busbars, according to an embodiment.

FIG. 7F shows the cross-sectional view of the bonded busbars, according to an embodiment. More specifically, FIG. 7F shows the sectional view along cut planes A-A, indicated by dashed arrows shown in FIG. 7E. As shown in FIG. 7F, busbars 722 and 724 have complementary shapes and can interlock with one another to form a continuous metallic block, similar to a conventional continuous busbar. This combined busbar can function as both a current collector for each strip and an inter-strip current conductor. Because the dimension of the combined busbar can be similar to a conventional busbar (e.g., busbar 106 shown in FIG. 1A), the combined busbar can provide the same current-collection capability. On the other hand, for inter-strip current flow, the resistance of the combined busbar can be about half of that of two stacked busbars.

Figure 8A:
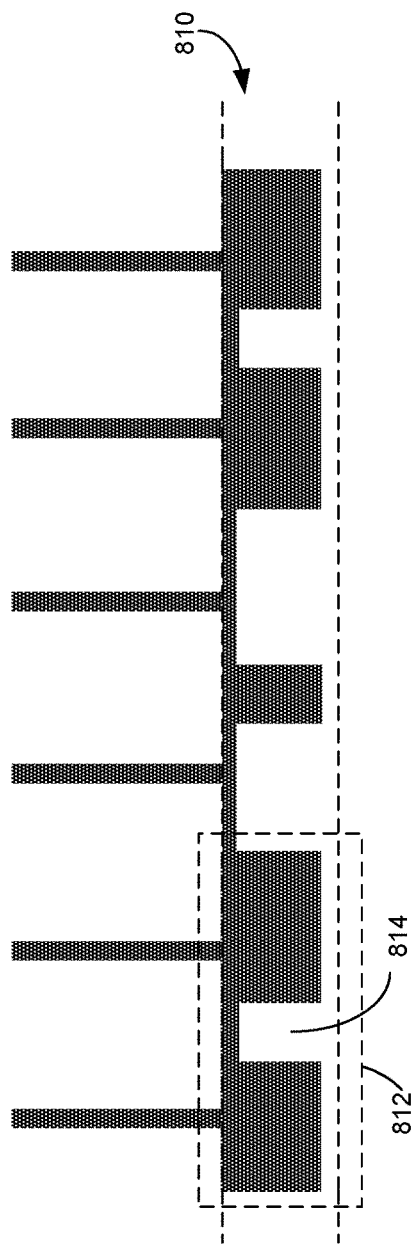
FIGS. 8A and 8B show the partial top view of a top metallic grid and a bottom metallic grid, respectively, of a photovoltaic structure, according to an embodiment.
Figure 8B:
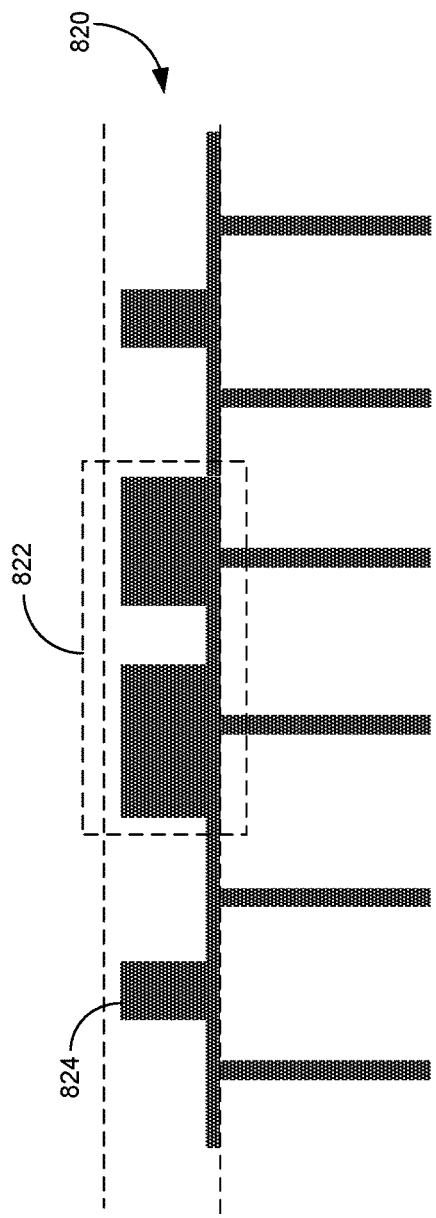

In the example shown in FIGS. 7A-7B, the busbars on opposite surfaces of the photovoltaic structures interdigitate with one another, and the metallic segments all have the same length. Other variations can also be possible, as long as the shapes (topology profiles) of the two busbars are complementary to each other to allow them to be interlocked with each other when stacked. FIGS. 8A and 8B show the partial top view of a top metallic grid and a bottom metallic grid, respectively, of a photovoltaic structure, according to an embodiment.

Busbar 810 can be similar to busbar 610 shown in FIG. 6A, and can include a number of segments, such as segment 812. Busbar 820 can also include a number of segments, such as segment 822. The length of segments 812 and 822 can be similar to the length of segments 612 and 614. However, to further release the thermal stress, an opening can be created in each segment. For example, opening 814 can be created in segment 812. Moreover, at the corresponding location in the opposite grid, an additional segment can be added (e.g., segment 824).

Figure 9A:
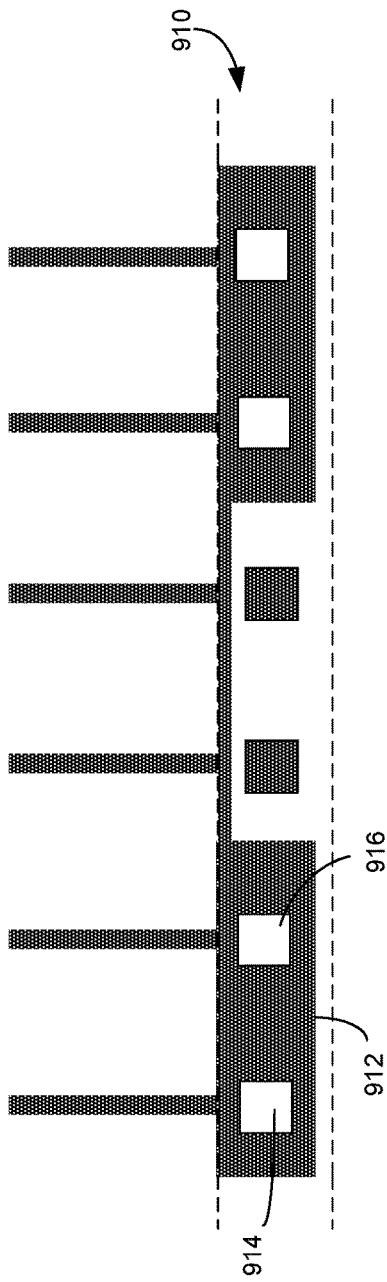
FIGS. 9A and 9B show the partial top view of a top metallic grid and a bottom metallic grid, respectively, of a photovoltaic structure, according to an embodiment.
Figure 9B:
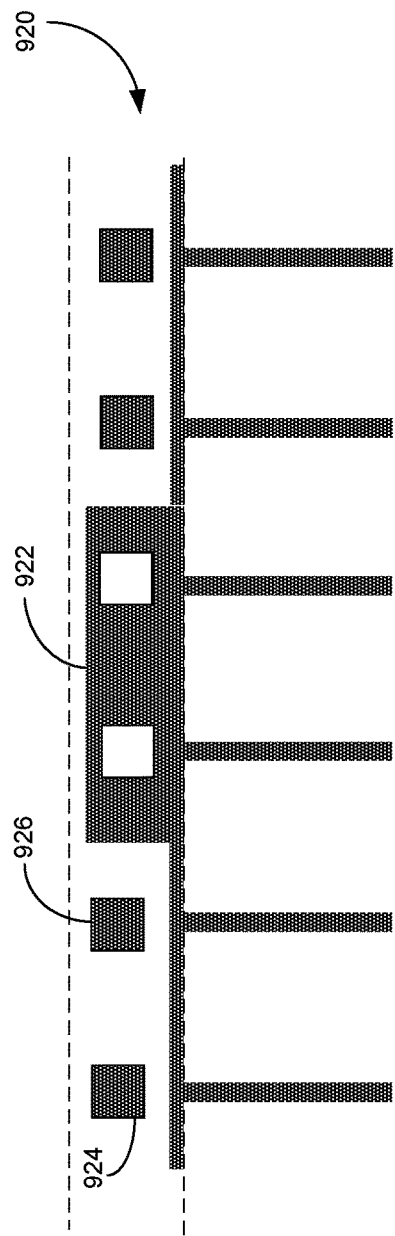

FIGS. 9A and 9B show the partial top view of a top metallic grid and a bottom metallic grid, respectively, of a photovoltaic structure, according to an embodiment. Busbar 910 can be similar to busbar 610 shown in FIG. 6A, and can include a number of segments, such as segment 912. Busbar 920 can also include a number of segments, such as segment 922. The length of segments 912 and 922 can be similar to the length of segments 612 and 614. Similar to the example shown in FIGS. 8A and 8B, an opening can be created in each segment to further release the thermal stress, such as openings 914 and 916 in segment 912. Moreover, at the corresponding location in the opposite grid, additional metallic columns can be added (e.g., columns 924 and 926).

To ensure that when a strip is partially overlapped with an adjacent strip at the edge, the edge busbars (one from the top strip and one from the bottom strip) properly interlock with one another, one needs to ensure precise control of the positions of the strips. To do so, an automated vision system, either a laser-based system or a camera-based system, can be used to assist in positioning the strips, such that one strip can be picked up and placed at a precise location so that its busbar interlocks with a busbar of another strip. A detailed description of a vision system that assists in the cascading of the strips can be found in U.S. patent application Ser. No. 14/866,766, entitled "SYSTEMS AND METHODS FOR CASCADING PHOTOVOLTAIC STRUCTURES," filed Sep. 25, 2015, the disclosure of which is incorporated herein by reference in its entirety.

Figure 10:
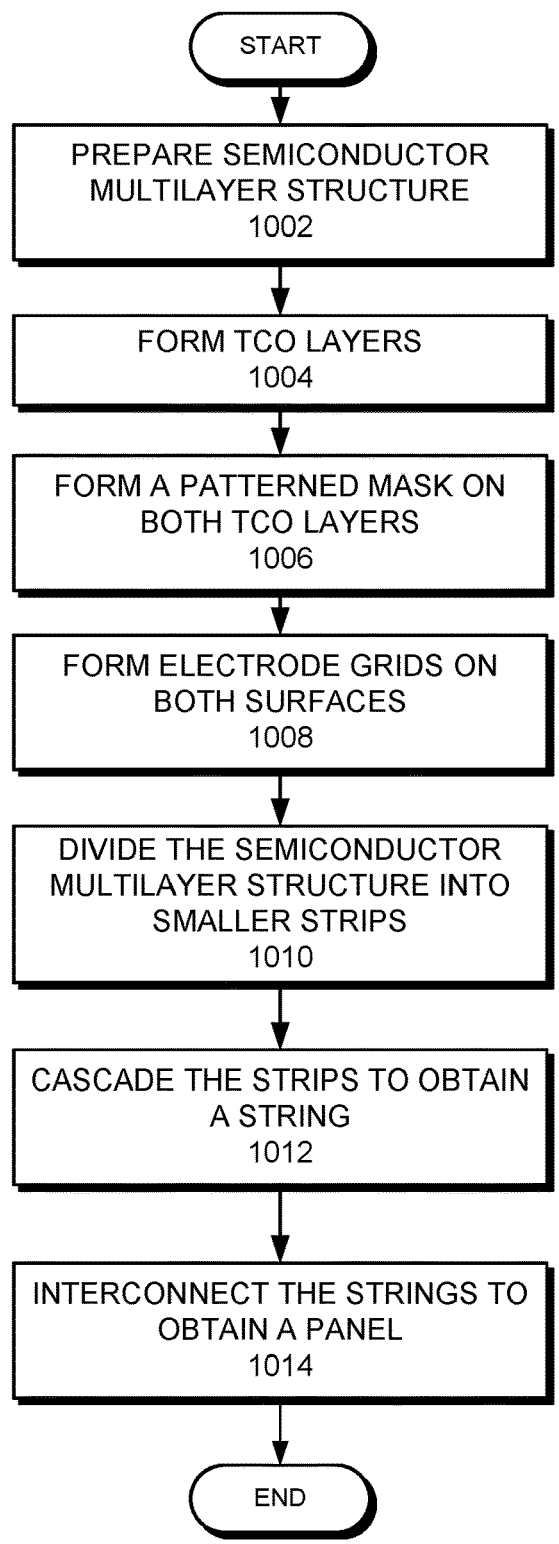
FIG. 10 shows an exemplary process for forming a solar panel, according to an embodiment.

FIG. 10 shows an exemplary process for forming a solar panel, according to an embodiment. During fabrication, a semiconductor multilayer structure can be prepared (operation 1002). The semiconductor multilayer structure can include the base, the emitter, and/or the surface field layer of a photovoltaic structure. The semiconductor multilayer can also optionally include quantum tunneling barrier (QTB) layers on one or both sides of the base layer. A transparent conducting oxide (TCO) layer can then be formed on both sides of the semiconductor multilayer structure (operation 1004). Alternatively, a metallic adhesion layer can also be formed on the TCO layer using a PVD technology. Materials used to form the adhesive layers include, but are not limited to: Cu, Ti, titanium nitride ($TiN_x$), titanium tungsten ($TiW_x$), titanium silicide ($TiSi_x$), titanium silicon nitride (TiSiN), Ta, tantalum nitride ($TaN_x$), tantalum silicon nitride ($TaSiN_x$), nickel vanadium (NiV), tungsten nitride ($WN_x$), Co, W, Cr, Mo, Ni, and their combinations Subsequently, a patterned mask layer can be formed on the TCO layers (or on the metallic adhesion layers) (operation 1006). The patterned mask layer can include dry film photoresist or a wax-based mask. In some embodiments, the patterned mask layer can be formed by direct laser writing on a wax layer. A detailed description of how to form a wax plating mask can be found in U.S. patent application Ser. No. 15/072,200, entitled "SYSTEM AND METHOD FOR CREATING A PATTERN ON A PHOTOVOLTAIC STRUCTURE," filed Mar. 16, 2016, the disclosure of which is incorporated herein by reference in its entirety.

The patterned mask can define the electrode grid, including the finger lines and the busbar. In some embodiments, the patterned mask on opposite surfaces of the photovoltaic structures can define busbars with shapes that are complementary to each other, such as the examples shown in FIGS. 4A-4B, FIGS. 7A-7B, FIGS. 8A-8B, and FIGS. 9A-9B. Using the patterned mask, the electrode grids having complementary busbars can be formed using a single electroplating process (operation 1008). More specifically, the photovoltaic structures with plating masks on both surfaces can be submerged in an electrolyte bath.

Subsequently, the photovoltaic structure can be divided into smaller strips (operation 1010), and multiple strips can be cascaded to form a serially connected string (operation 1012). More specifically, when two adjacent strips are cascaded with the edge of a strip overlapping the edge of the other strip, the corresponding edge busbars of these two strips interlock with each other. Conductive paste can also be applied onto the busbars before the strips are cascaded to ensure that the interlocking busbars are bonded together, and that a busbar of one strip can also be bonded to the surface of the other strip. Finally, the strings can be interconnected to form a panel (operation 1014).

In general, embodiments of the present invention provide various busbar designs to enhance the mechanical bonding and electrical coupling between cascaded strips. By designing busbars having complementary topology profiles, one can ensure that busbars from two cascaded strips can interlock with one another. The interlocked busbars can function both as the current collector for each strip and as the inter-strip conductor. Because the interlocked busbars can provide a shorter current path between two cascaded strips, the series resistance can be reduced. On the other hand, because the busbars have complementary topology profiles, one busbar of one strip can be bonded to the surface (which can be a TCO layer) of the other strip via conductive paste, thus providing stronger bonding between the strips.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A photovoltaic structure, comprising:
    a first metallic grid positioned on a first surface of the photovoltaic structure, wherein the first metallic grid includes a first set of discontinuous segments positioned near an edge of the photovoltaic structure; and
    a second metallic grid positioned on a second surface of the photovoltaic structure, wherein the second metallic grid includes a second set of discontinuous segments positioned near an opposite edge of the photovoltaic structure;
    wherein the first and the second sets of discontinuous segments have substantially complementary topology profiles such that, when the edge of the photovoltaic structure overlaps with an opposite edge of an adjacent photovoltaic structure with a same metallic-grid configuration, a respective segment on the first surface of the photovoltaic structure fits in a corresponding gap between two neighboring segments on the second surface of the adjacent photovoltaic structure, thereby facilitating interlocking of the segments between the two photovoltaic structures wherein, within each of the first and second metallic grids, the discontinuous segments are not directly coupled to one another by a metallic material except by segments of another grid when two photovoltaic structures are overlapped.

2. The photovoltaic structure of claim 1, wherein the discontinuous segments within a respective set have substantially the same length.

3. The photovoltaic structure of claim 1, wherein the first metallic grid and the second metallic grid each include a plurality of finger lines.

4. The photovoltaic structure of claim 1, wherein the first metallic grid and the second metallic grid each include an electroplated Cu layer.

5. The photovoltaic structure of claim 1, further comprising a layer of conductive paste, wherein the conductive paste is configured to bond the respective segment on the first surface of the photovoltaic structure to a portion of the second surface of the adjacent photovoltaic structure.

6. A photovoltaic structure, comprising:
    a multilayer photovoltaic body;
    a first metallic grid positioned on a first surface of the photovoltaic body, wherein the first metallic grid includes a first set of discontinuous segments positioned near an edge of the photovoltaic structure; and
    a second metallic grid positioned on a second surface of the photovoltaic body, wherein the second metallic grid includes a second set of discontinuous segments positioned near an opposite edge of the photovoltaic structure;
    wherein the first and the second sets of discontinuous segments have substantially complementary topology profiles such that, when the edge of the photovoltaic structure overlaps with an opposite edge of an adjacent photovoltaic structure with a same metallic-grid configuration, a respective segment on the first surface of the photovoltaic structure fits in a corresponding gap between two neighboring segments on the second surface of the adjacent photovoltaic structure, thereby facilitating interlocking of the segments between the two photovoltaic structures wherein, within each of the first and second metallic grids, the discontinuous segments are not directly coupled to one another by a metallic material except by segments of another grid when two photovoltaic structures are overlapped.

7. The photovoltaic structure of claim 6, wherein the discontinuous segments within a respective set have substantially the same length.

8. The photovoltaic structure of claim 6, wherein the first metallic grid and the second metallic grid each include a plurality of finger lines.

9. The photovoltaic structure of claim 6, wherein the first metallic grid and the second metallic grid each include an electroplated Cu layer.

10. The photovoltaic structure of claim 6, further comprising a layer of conductive paste, wherein the conductive paste is configured to bond the respective segment on the first surface of the photovoltaic structure to a portion of the second surface of the adjacent photovoltaic structure.

11. The photovoltaic structure of claim 6, wherein the multilayer photovoltaic body comprises:
    a base layer;
    a first quantum tunneling barrier layer positioned on a first surface of the base layer;
    a second quantum tunneling barrier layer positioned on a second surface of the base layer;
    an emitter layer positioned on the first quantum tunneling barrier layer;
    a surface field layer positioned on the second quantum tunneling barrier layer;
    a first transparent conductive oxide layer positioned on the emitter layer; and
    a second transparent conductive oxide layer positioned on surface field layer.

12. A method for fabricating a photovoltaic structure, comprising:
    obtaining a multilayer photovoltaic body;
    forming a first metallic grid on a first surface of the photovoltaic body, wherein the first metallic grid includes a first set of discontinuous segments positioned near an edge of the photovoltaic structure; and
    forming a second metallic grid on a second surface of the photovoltaic body, wherein the second metallic grid includes a second set of discontinuous segments positioned near an opposite edge of the photovoltaic structure;
    wherein the first and the second sets of discontinuous segments have substantially complementary topology profiles such that, when the edge of the photovoltaic structure overlaps with an opposite edge of an adjacent photovoltaic structure with a same metallic-grid configuration, a respective segment on the first surface of the photovoltaic structure fits in a corresponding gap between two neighboring segments on the second surface of the adjacent photovoltaic structure, thereby facilitating interlocking of the segments between the two photovoltaic structures wherein, within each of the first and second metallic grids, the discontinuous segments are not directly coupled to one another by a metallic material except by segments of another grid when two photovoltaic structures are overlapped.

13. The method of claim 12, wherein forming the first and second metallic grids involves electroplating a Cu layer on the first and second surfaces of the photovoltaic structure.

14. The method of claim 13, wherein electroplating the Cu layer involves forming a plating mask by direct laser writing on a wax layer.

* * * * *